(12) United States Patent
Sung et al.

(10) Patent No.: US 12,550,427 B2
(45) Date of Patent: Feb. 10, 2026

(54) VERTICAL INVERTER FORMATION ON STACKED FIELD EFFECT TRANSISTOR (SFET)

(71) Applicant: International Business Machines Corporation, Armonk, NY (US)

(72) Inventors: Min Gyu Sung, Latham, NY (US); Julien Frougier, Albany, NY (US); Kangguo Cheng, Schenectady, NY (US); Ruilong Xie, Niskayuna, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 630 days.

(21) Appl. No.: 17/936,416

(22) Filed: Sep. 29, 2022

(65) Prior Publication Data
US 2024/0113117 A1    Apr. 4, 2024

(51) Int. Cl.
*H10D 84/85* (2025.01)
*H01L 21/02* (2006.01)
(Continued)

(52) U.S. Cl.
CPC ..... *H10D 84/856* (2025.01); *H01L 21/02603* (2013.01); *H10D 30/014* (2025.01);
(Continued)

(58) Field of Classification Search
CPC .... H10D 84/856; H10D 30/014; H10D 30/43; H10D 30/6729; H10D 30/6735;
(Continued)

(56) References Cited

U.S. PATENT DOCUMENTS 9,659,963 B2   5/2017  Cheng et al.
9,837,414 B1  12/2017  Balakrishnan et al.
(Continued)

FOREIGN PATENT DOCUMENTS

CN     113690238 A   11/2021
EP       3979306 A1   4/2022
(Continued)

*Primary Examiner* — Christine S. Kim
*Assistant Examiner* — Nathalie R Fayette
(74) *Attorney, Agent, or Firm* — CANTOR COLBURN LLP; Samuel Waldbaum

(57) ABSTRACT

Embodiments of the present invention are directed to stacked field effect transistors (SFETs) having integrated vertical inverters. In a non-limiting embodiment, a first nanosheet is vertically stacked over a second nanosheet. A common gate is formed around a channel region of the first and second nanosheets. A top source or drain region is formed in direct contact with the first nanosheet and a bottom source or drain region is formed in direct contact with the second nanosheet. A first portion of the top source or drain region is shorted to a first portion of the bottom source or drain region to define a common source or drain region. A second portion of the top source or drain region is electrically coupled to a second portion of the bottom source or drain region in series through the first nanosheet, the common source or drain region, and the second nanosheet.

20 Claims, 17 Drawing Sheets

(51) Int. Cl.
*H10D 30/01* (2025.01)
*H10D 30/43* (2025.01)
*H10D 30/67* (2025.01)
*H10D 62/10* (2025.01)
*H10D 84/01* (2025.01)
*H10D 84/03* (2025.01)
*H10D 88/00* (2025.01)

(52) U.S. Cl.
CPC ......... *H10D 30/43* (2025.01); *H10D 30/6729* (2025.01); *H10D 30/6735* (2025.01); *H10D 62/121* (2025.01); *H10D 84/0167* (2025.01); *H10D 84/017* (2025.01); *H10D 84/0186* (2025.01); *H10D 84/0188* (2025.01); *H10D 84/038* (2025.01); *H10D 88/01* (2025.01)

(58) Field of Classification Search
CPC ............. H10D 62/121; H10D 84/0167; H10D 84/017; H10D 84/0186; H10D 84/0188; H10D 84/038; H10D 88/01; H10D 30/6757; H10D 84/85; H10D 88/00; H01L 21/02603
See application file for complete search history.

(56) References Cited

U.S. PATENT DOCUMENTS

| | | |
|---|---|---|
| 9,887,197 B2 | 2/2018 | Balakrishnan et al. |
| 10,192,867 B1 | 1/2019 | Frougier et al. |
| 10,366,931 B2 | 7/2019 | Xie et al. |
| 10,559,692 B2 | 2/2020 | Reznicek et al. |
| 10,593,673 B2 | 3/2020 | Miao et al. |
| 10,741,641 B2 | 8/2020 | Guillorn et al. |
| 10,804,165 B2 | 10/2020 | Seo et al. |
| 10,818,674 B2 | 10/2020 | Mann et al. |
| 10,916,629 B2 | 2/2021 | Reznicek et al. |
| 10,964,706 B2 | 3/2021 | Smith et al. |
| 11,043,493 B2 | 6/2021 | Bi et al. |
| 11,088,258 B2 | 8/2021 | Wang et al. |
| 11,121,044 B2 | 9/2021 | Cheng et al. |
| 11,158,544 B2 | 10/2021 | Cheng et al. |
| 11,177,258 B2 | 11/2021 | Xie et al. |
| 11,244,949 B2 * | 2/2022 | Weckx et al. .......... B82Y 10/00 |
| 11,309,319 B2 | 4/2022 | Mann et al. |
| 2021/0175128 A1 | 6/2021 | Gardner et al. |
| 2022/0085013 A1 | 3/2022 | Reznicek et al. |
| 2022/0108991 A1 | 4/2022 | Sio et al. |
| 2022/0310456 A1 * | 9/2022 | Hall et al. .......... H10D 30/6735 |

FOREIGN PATENT DOCUMENTS

| | | |
|---|---|---|
| TW | 202040791 A | 11/2020 |
| TW | 202135281 A | 9/2021 |
| TW | 202215666 A | 4/2022 |
| WO | 2021096616 A1 | 5/2021 |

* cited by examiner

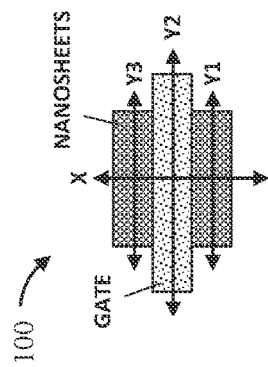
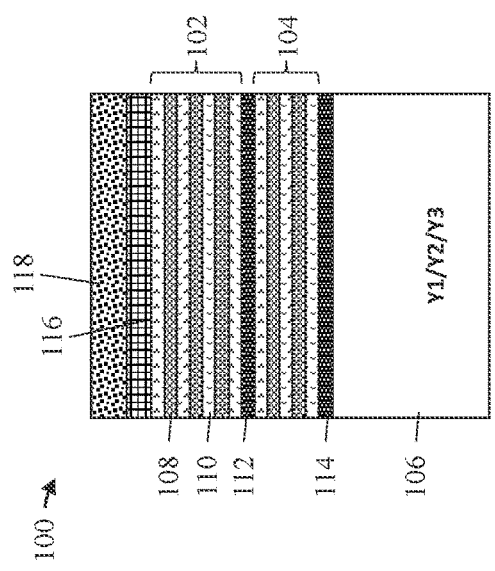
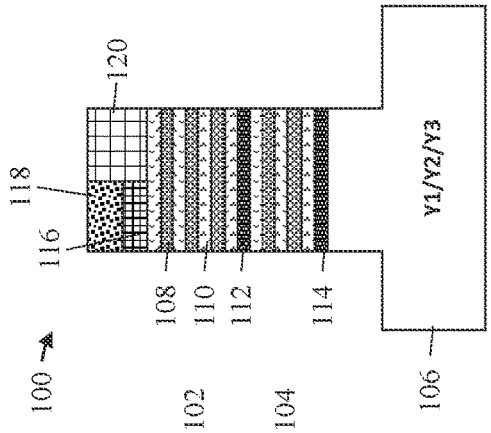
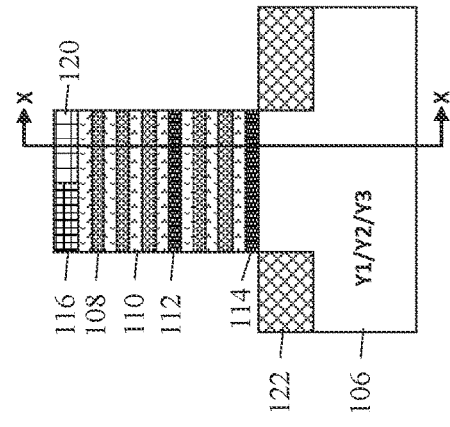
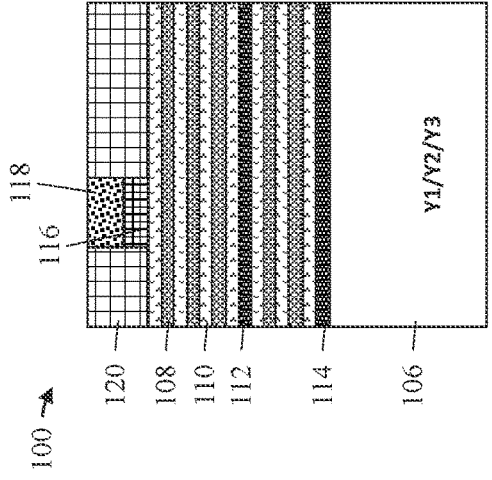

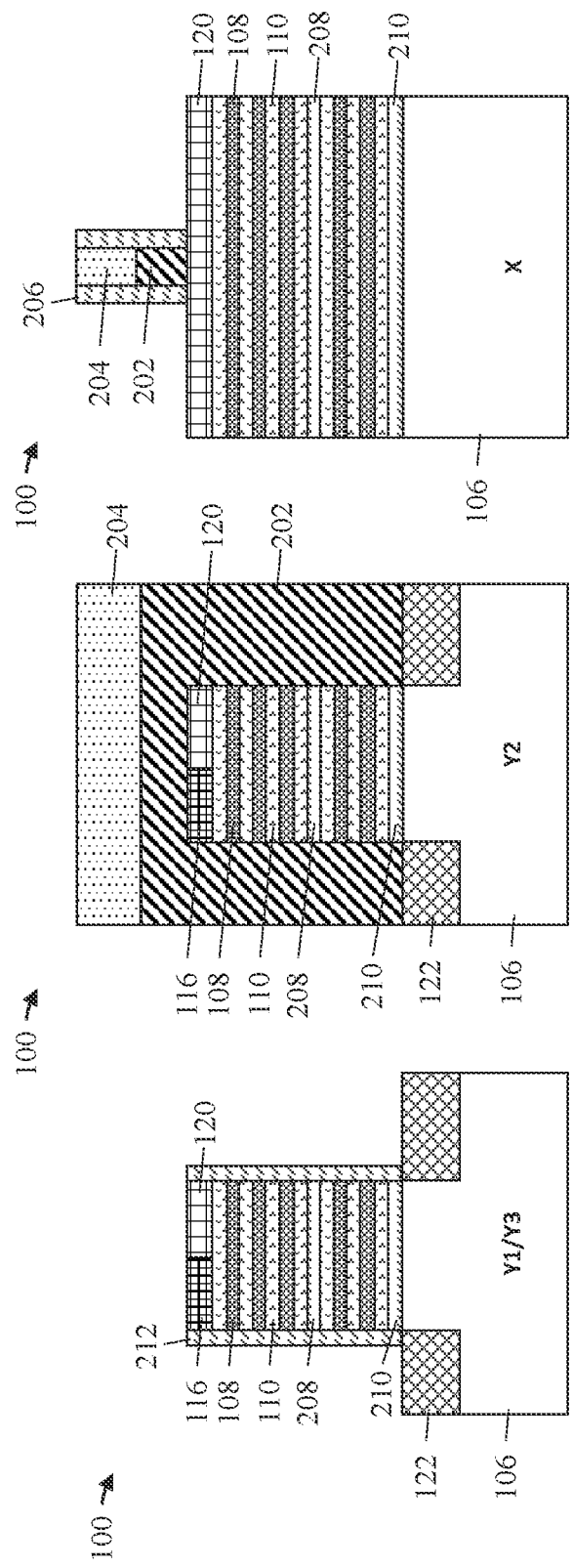

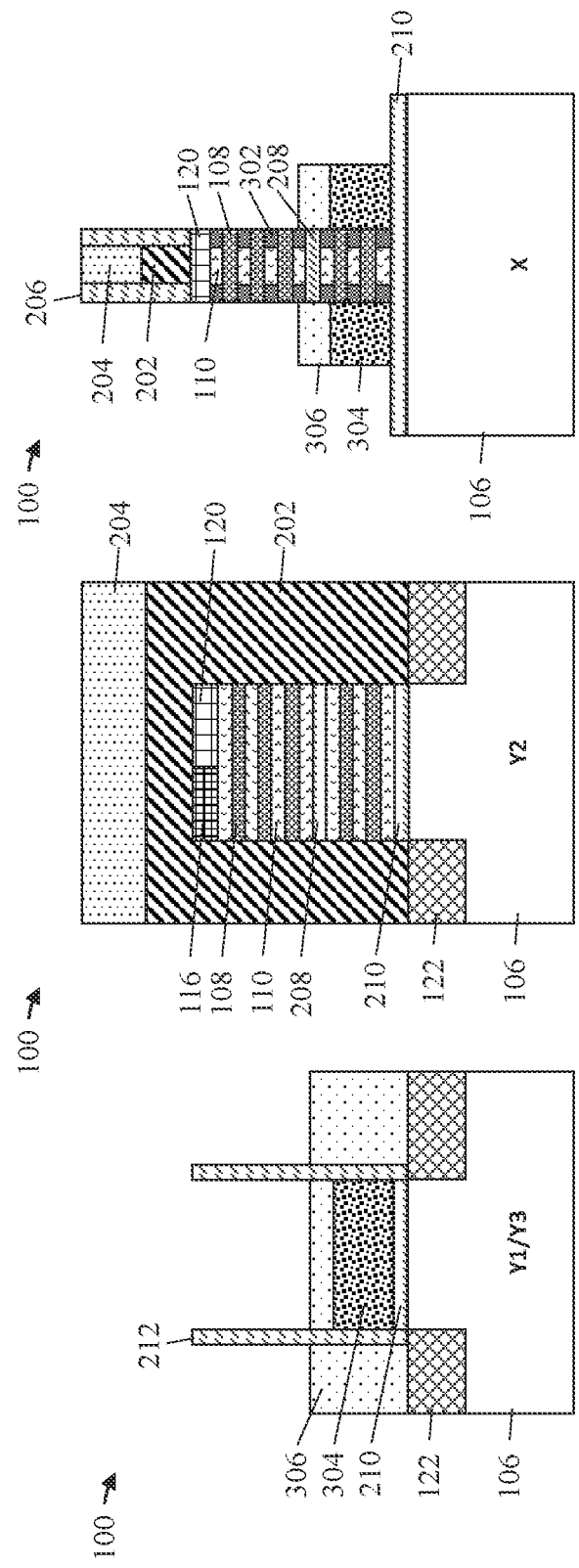
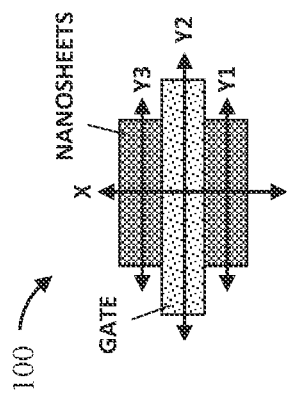
FIG. 3A
FIG. 3B
FIG. 3C
FIG. 3D

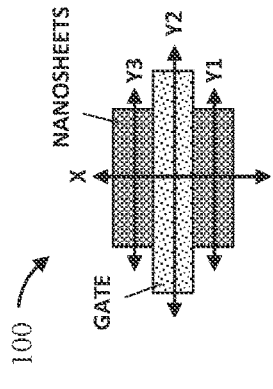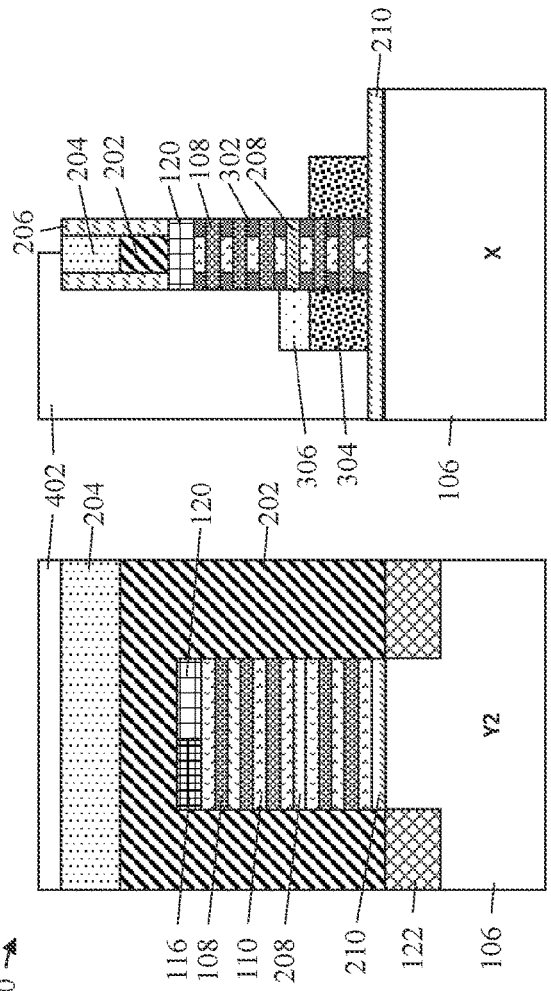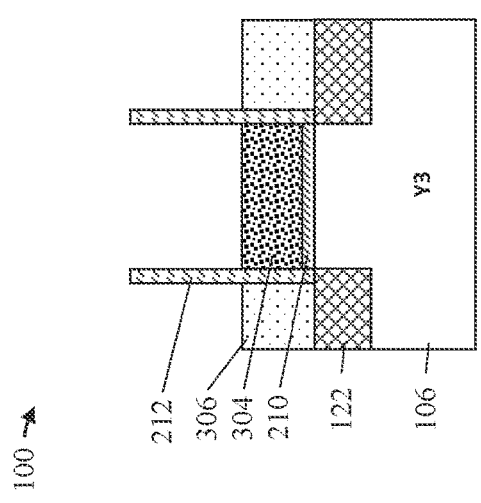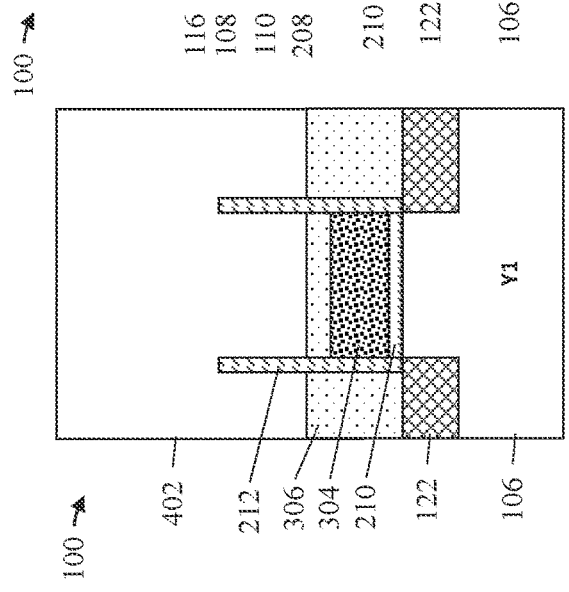
FIG. 4A  FIG. 4B  FIG. 4C  FIG. 4D  FIG. 4E

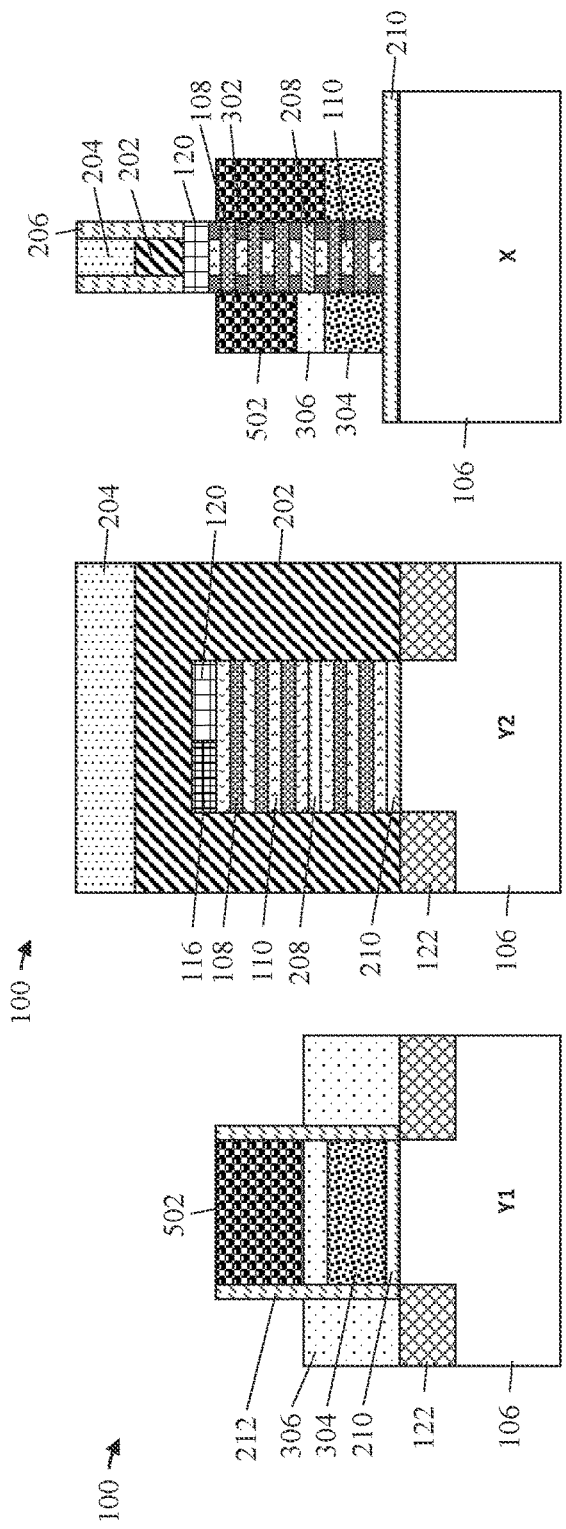
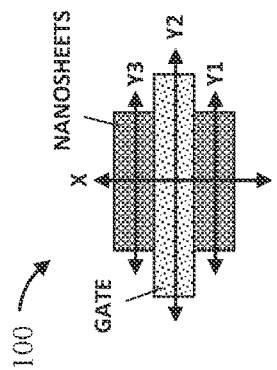
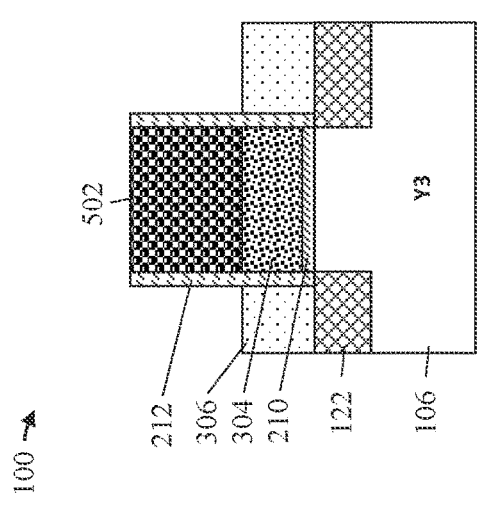

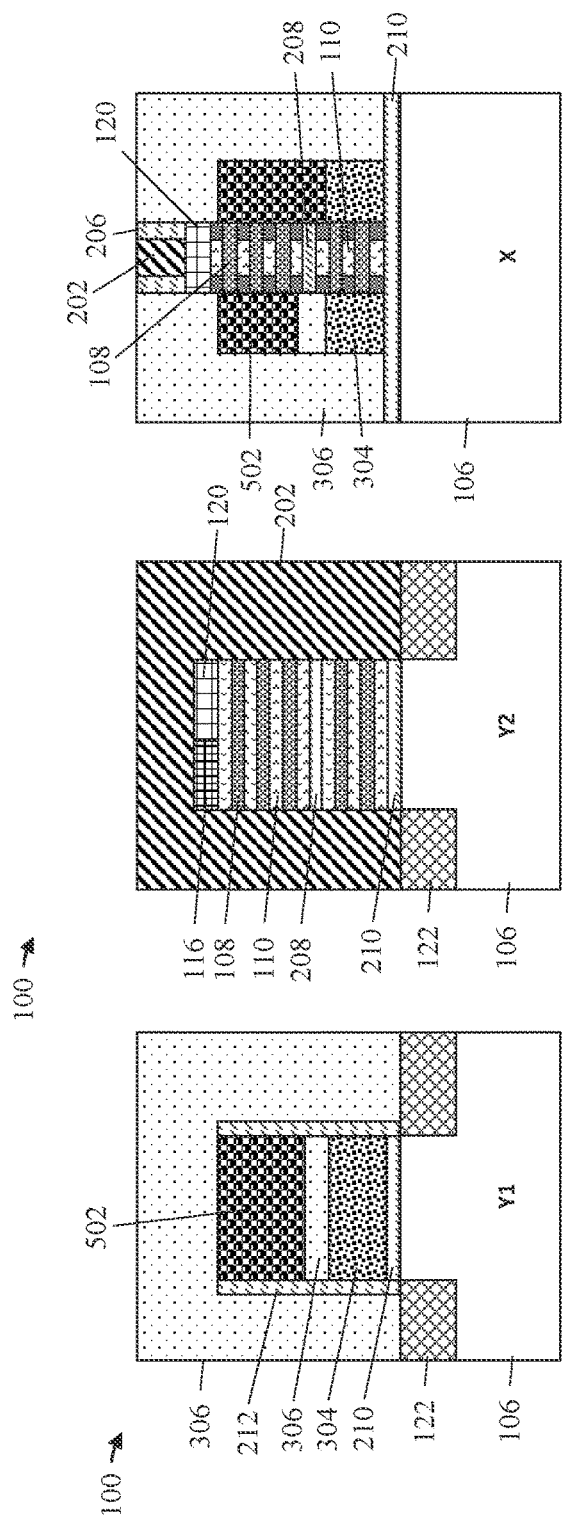
FIG. 6C
FIG. 6B
FIG. 6A
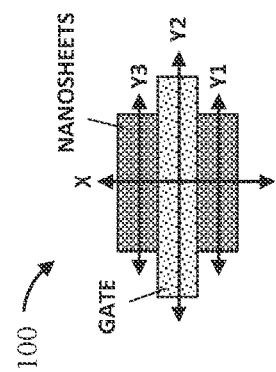
FIG. 6E
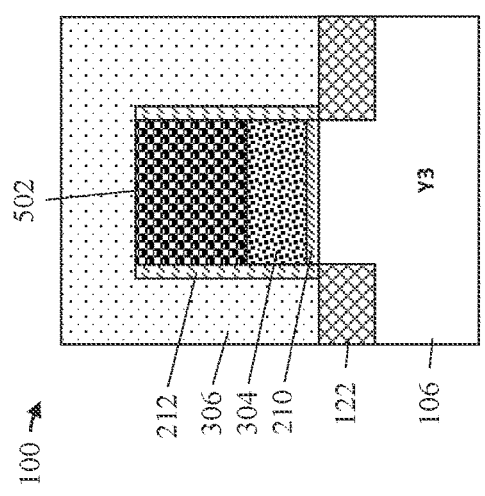
FIG. 6D

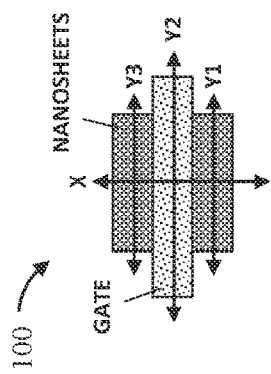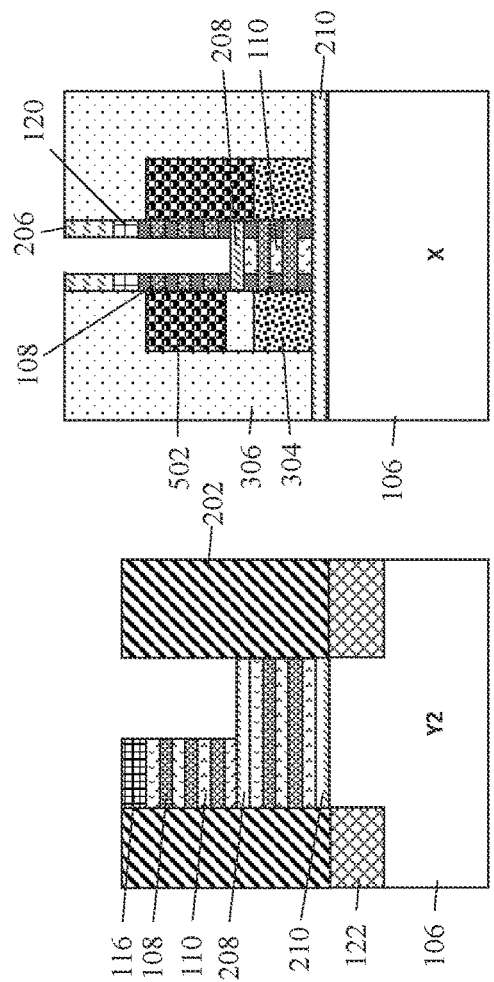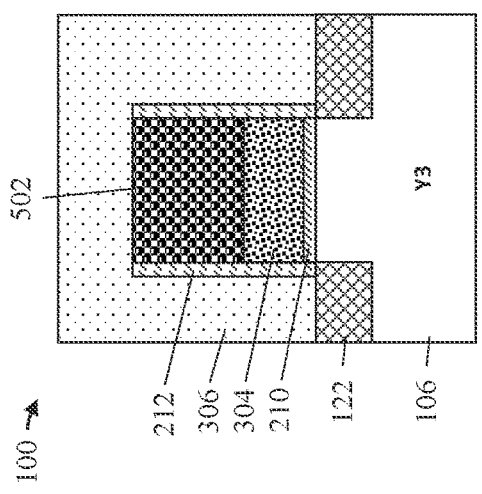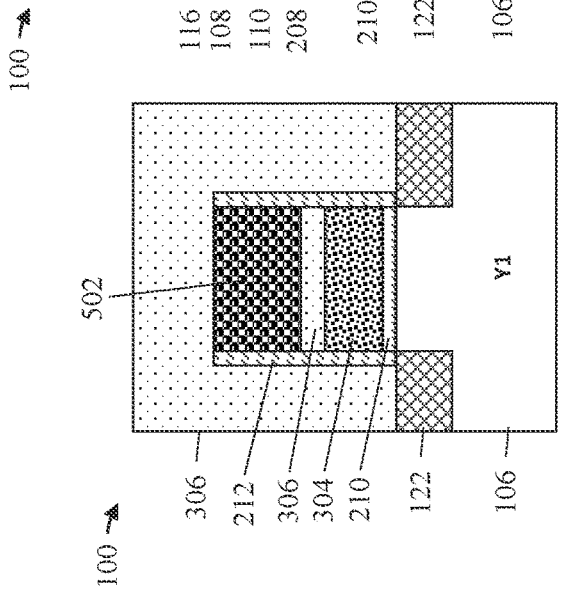

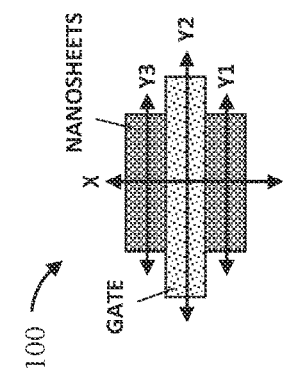
FIG. 9E
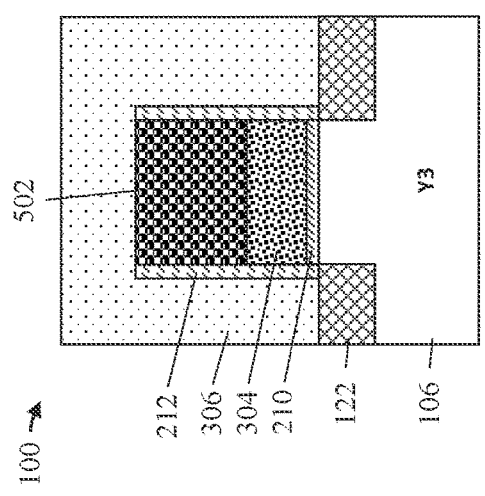
FIG. 9D
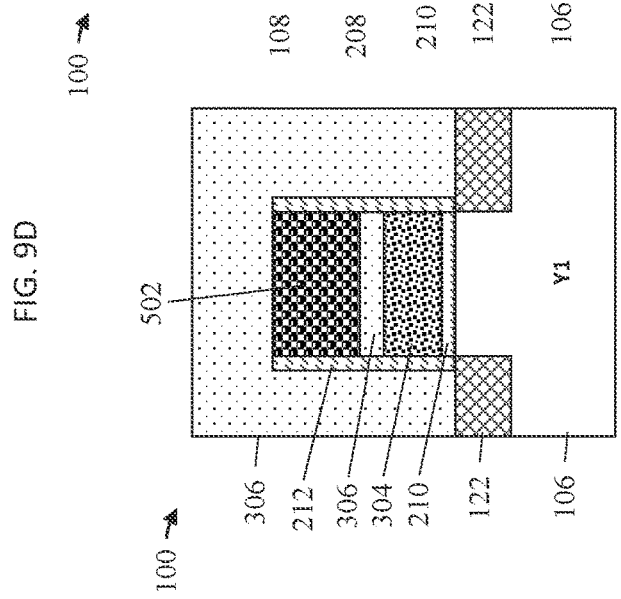
FIG. 9C
FIG. 9B
FIG. 9A

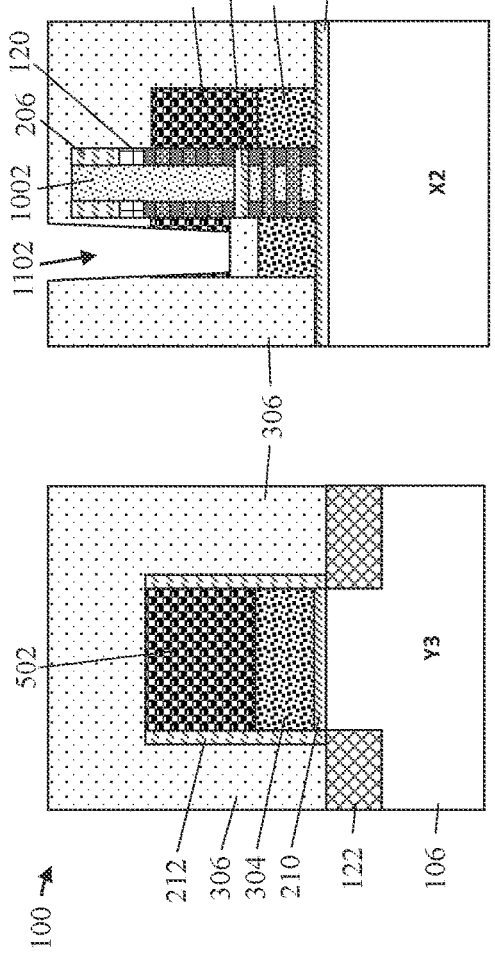
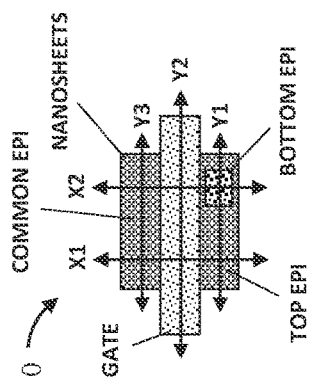
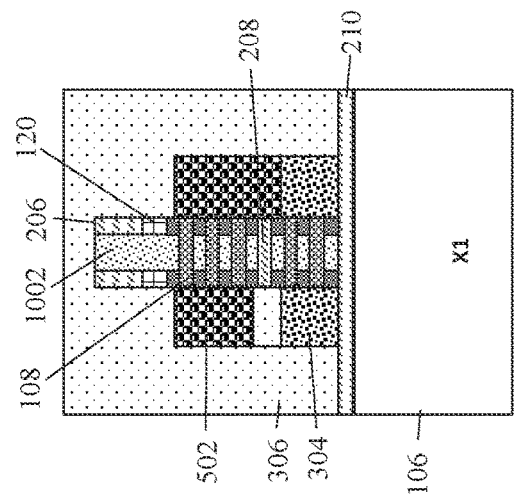
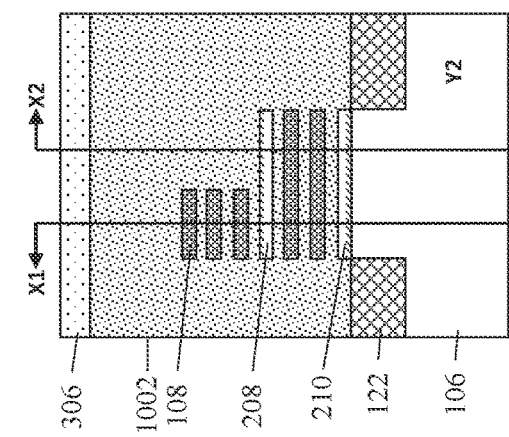
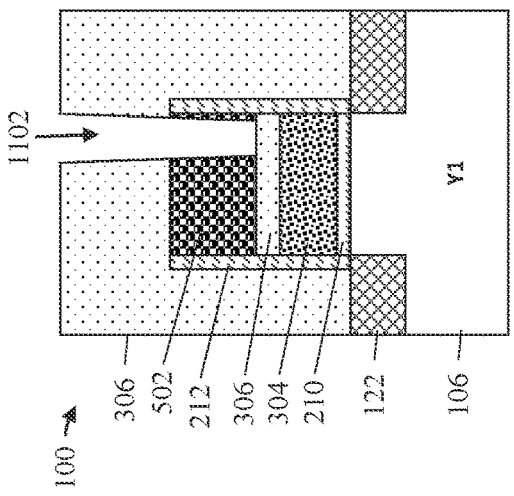

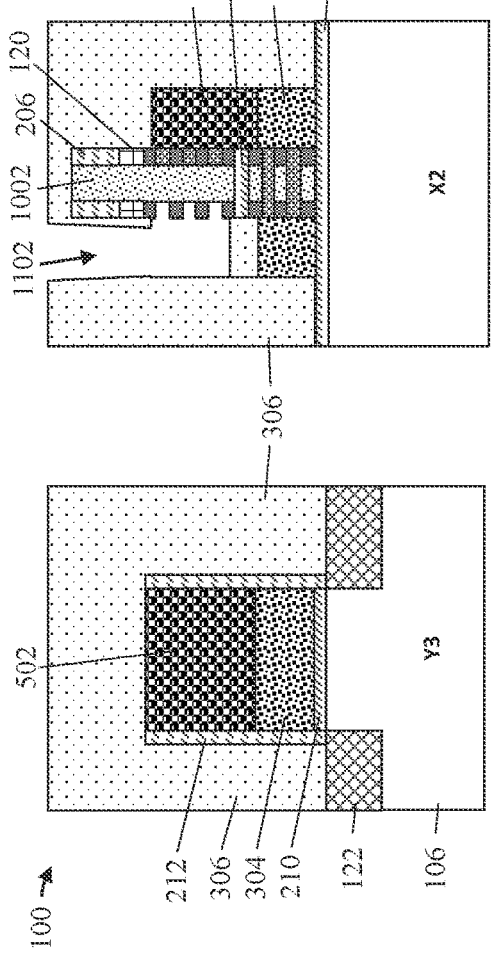
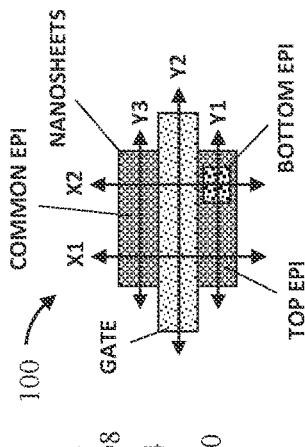
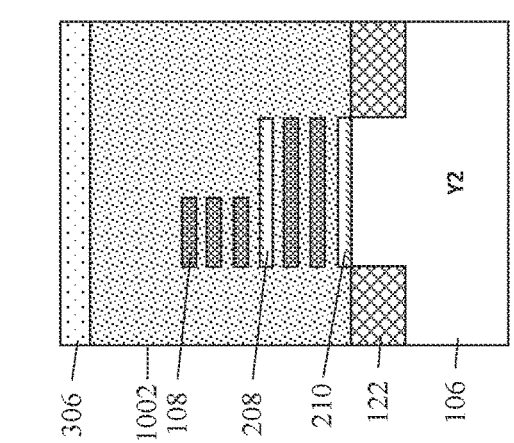
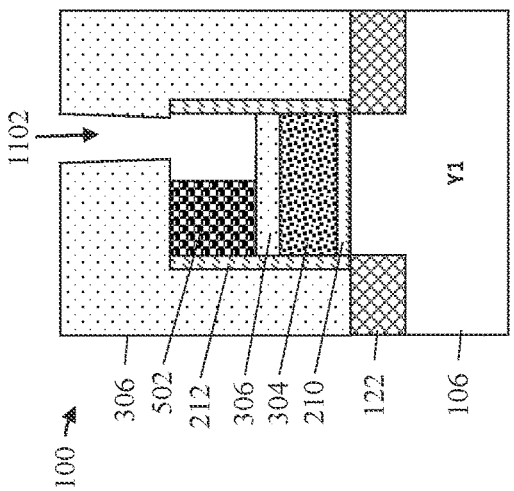
FIG. 12A
FIG. 12B
FIG. 12C
FIG. 12D
FIG. 12E
FIG. 12F

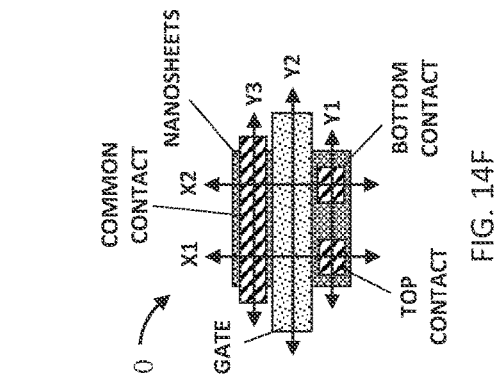
FIG. 14F
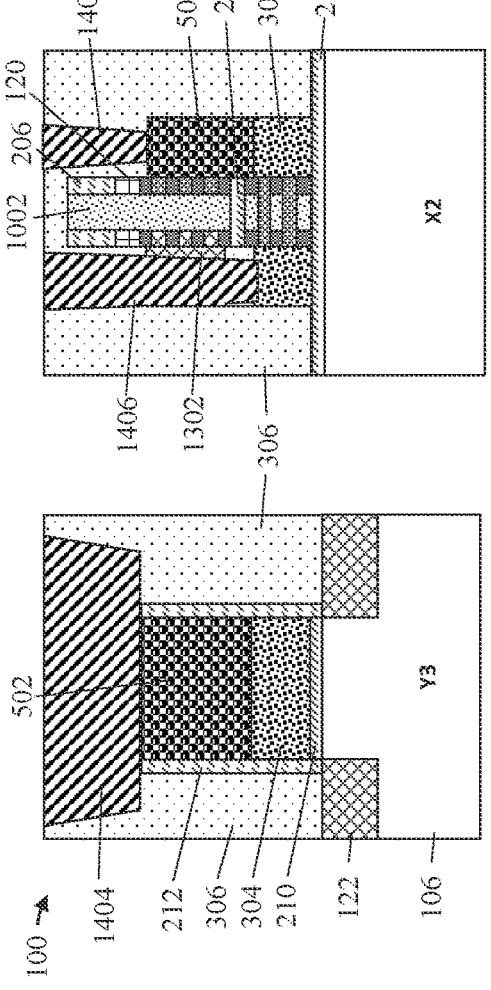
FIG. 14E
FIG. 14D
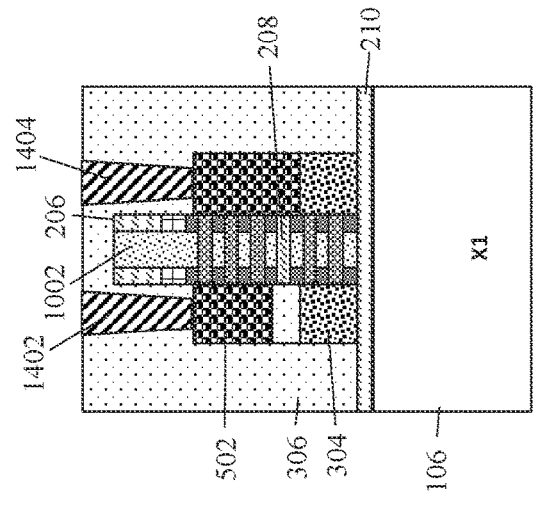
FIG. 14C
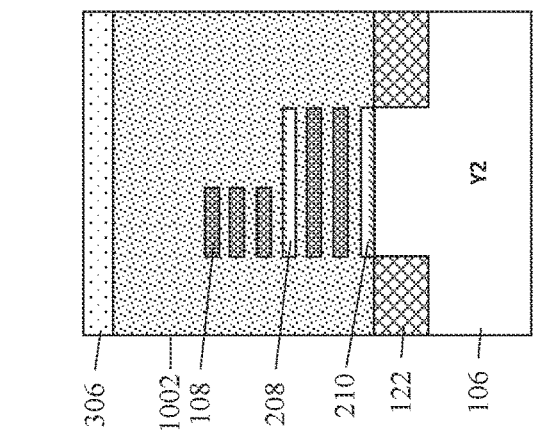
FIG. 14B
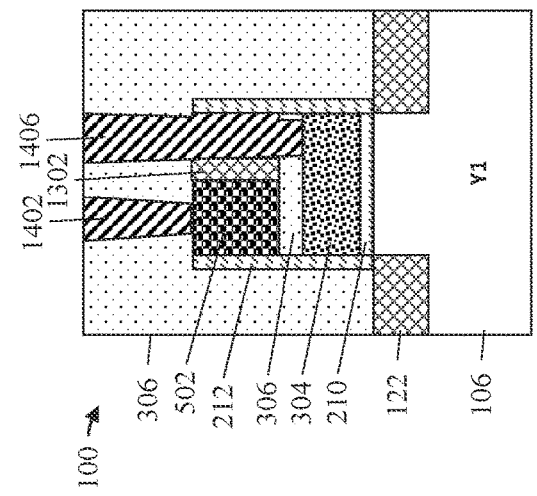
FIG. 14A

VERTICAL INVERTER FORMATION ON STACKED FIELD EFFECT TRANSISTOR (SFET)

BACKGROUND

The present invention generally relates to fabrication methods and resulting structures for semiconductor devices, and more specifically, to processing methods and resulting structures for stacked field effect transistors (SFETs) with integrated vertical inverters.

Known metal oxide semiconductor field effect transistor (MOSFET) fabrication techniques include process flows for constructing planar field effect transistors (FETs). A planar FET includes a substrate (also referred to as a silicon slab); a gate formed over the substrate; source and drain regions formed on opposite ends of the gate; and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, GAA transistors (also referred to as nanosheet FETs and nanowire FETs) include a non-planar architecture that provides increased device density and some increased performance over lateral devices. In nanosheet FETs, in contrast to conventional planar FETs, the channel is implemented as a plurality of stacked and spaced-apart nanosheets. The gate stack wraps around the full perimeter of each nanosheet, thus enabling fuller depletion in the channel region, and also reducing short-channel effects due to steeper subthreshold swing (SS) and smaller drain induced barrier lowering (DIBL). As MOSFET fabrication continues to develop, stacked FET architectures (SFETs) are being investigated to meet aggressive gate length (Lg) scaling requirements and current drive capabilities. In a stacked FET, two (or more) FETs are vertically stacked over a substrate to reduce the overall device footprint.

SUMMARY

Embodiments of the invention are directed to a method for forming a semiconductor device having integrated vertical inverters. A non-limiting example of the method includes vertically stacking a first nanosheet over a second nanosheet. A common gate is formed around a channel region of the first and second nanosheets. A top source or drain region is formed in direct contact with the first nanosheet and a bottom source or drain region is formed in direct contact with the second nanosheet. A first portion of the top source or drain region is shorted to a first portion of the bottom source or drain region to define a common source or drain region. A second portion of the top source or drain region is electrically coupled to a second portion of the bottom source or drain region in series through the first nanosheet, the common source or drain region, and the second nanosheet.

In some embodiments, the method further includes forming a first nanosheet stack that includes the first nanosheet and one or more additional nanosheets and a second nanosheet stack that includes the second nanosheet and one or more additional nanosheets, enabling a stacked transistor architecture having any number of channels. In some embodiments, the semiconductor device is a stacked field effect transistor having a reduced footprint relative to non-stacked architectures.

In some embodiments, the stacked field effect transistor includes a stacked pFET and nFET, enabling a complementary stacked field effect transistor structure. In some embodiments, the first nanosheet stack defines a portion of one of the nFET and the pFET and the second nanosheet stack defines a portion of the other one of the nFET and the pFET.

In some embodiments, the method further includes forming a middle dielectric isolation structure between the first nanosheet and the second nanosheet. In some embodiments, the middle dielectric isolation structure is in direct contact with the common source or drain region. Advantageously, the middle dielectric isolation structure contributes to enforcing the in-series connection between the second portion of the top source or drain region and the second portion of the bottom source or drain region.

In some embodiments, a bottom source or drain contact is formed on a surface of the bottom source or drain region. In some embodiments, an isolation structure is formed between the bottom source or drain contact and the top source or drain region. In some embodiments, a portion of the isolation structure is between the bottom source or drain contact and the common gate. The isolation structure prevents shorts between the top source or drain region and the bottom source or drain contact. The isolation structure further prevents shorts between the bottom source or drain contact and the common gate.

In some embodiments, a first sidewall of the first nanosheet is coplanar to a first sidewall of the second nanosheet and a second sidewall of the first nanosheet is recessed with respect to a second sidewall of the second nanosheet. Advantageously, configuring the nanosheets in this manner enforces the in-series connection between the second portion of the top source or drain region and the second portion of the bottom source or drain region.

Embodiments of the invention are directed to a semiconductor structure. A non-limiting example of the semiconductor structure includes a first nanosheet vertically stacked over a second nanosheet. A common gate is formed around a channel region of the first nanosheet and a channel region of the second nanosheet. A top source or drain region is in direct contact with the first nanosheet and a bottom source or drain region is in direct contact with the second nanosheet. In some embodiments, a first portion of the top source or drain region is shorted to a first portion of the bottom source or drain region to define a common source or drain region. In some embodiments, a second portion of the top source or drain region is electrically coupled to a second portion of the bottom source or drain region in series through the first nanosheet, the common source or drain region, and the second nanosheet.

Embodiments of the invention are directed to a semiconductor structure. A non-limiting example of the semiconductor structure includes a first vertical inverter cross-coupled to a second vertical inverter. Each vertical inverter can include a first nanosheet vertically stacked over a second nanosheet. The semiconductor structure further includes a first access transistor coupled to the first vertical inverter and a second access transistor coupled to the second vertical inverter. In some embodiments, a gate of the first access transistor is coupled to a word line and a gate of the second access transistor is coupled to the word line. In some embodiments, the first access transistor is further coupled to a first bit line and the second access transistor is further coupled to a second bit line.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1A depicts a top-down reference view of a semiconductor wafer after an initial set of processing operations according to one or more embodiments of the invention;

FIG. 1B depicts a cross-sectional view taken along the lines Y1/Y2/Y3 of FIG. 1A after the initial set of processing operations according to one or more embodiments of the invention;

FIG. 1C depicts a cross-sectional view taken along the lines Y1/Y2/Y3 of FIG. 1A after a processing operation according to one or more embodiments of the invention;

FIG. 1D depicts a cross-sectional view taken along the lines Y1/Y2/Y3 of FIG. 1A after a processing operation according to one or more embodiments of the invention;

FIG. 1E depicts a cross-sectional view taken along the lines Y1/Y2/Y3 of FIG. 1A after a processing operation according to one or more embodiments of the invention;

FIGS. 2A, 2B, and 2C depict cross-sectional views taken along the lines Y1/Y3, Y2, and X, respectively, of FIG. 2D after a processing operation according to one or more embodiments;

FIG. 2D depicts a top-down reference view of the semiconductor wafer according to one or more embodiments;

FIGS. 3A, 3B, and 3C depict cross-sectional views taken along the lines Y1/Y3, Y2, and X, respectively, of FIG. 3D after a processing operation according to one or more embodiments;

FIG. 3D depicts a top-down reference view of the semiconductor wafer according to one or more embodiments;

FIGS. 4A, 4B, 4C, and 4D depict cross-sectional views taken along the lines Y1, Y2, X, and Y3, respectively, of FIG. 4E after a processing operation according to one or more embodiments;

FIG. 4E depicts a top-down reference view of the semiconductor wafer according to one or more embodiments;

FIGS. 5A, 5B, 5C, and 5D depict cross-sectional views taken along the lines Y1, Y2, X, and Y3, respectively, of FIG. 5E after a processing operation according to one or more embodiments;

FIG. 5E depicts a top-down reference view of the semiconductor wafer according to one or more embodiments;

FIGS. 6A, 6B, 6C, and 6D depict cross-sectional views taken along the lines Y1, Y2, X, and Y3, respectively, of FIG. 6E after a processing operation according to one or more embodiments;

FIG. 6E depicts a top-down reference view of the semiconductor wafer according to one or more embodiments;

FIGS. 8A, 8B, 8C, and 8D depict cross-sectional views taken along the lines Y1, Y2, X, and Y3, respectively, of FIG. 8E after a processing operation according to one or more embodiments;

FIG. 8E depicts a top-down reference view of the semiconductor wafer according to one or more embodiments;

FIGS. 9A, 9B, 9C, and 9D depict cross-sectional views taken along the lines Y1, Y2, X, and Y3, respectively, of FIG. 9E after a processing operation according to one or more embodiments;

FIG. 9E depicts a top-down reference view of the semiconductor wafer according to one or more embodiments;

FIGS. 11A, 11B, 11C, 11D, and 11E depict cross-sectional views taken along the lines Y1, Y2, X1, Y3, and X2, respectively, of FIG. 11F after a processing operation according to one or more embodiments;

FIG. 11F depicts a top-down reference view of the semiconductor wafer according to one or more embodiments;

FIGS. 12A, 12B, 12C, 12D, and 12E depict cross-sectional views taken along the lines Y1, Y2, X1, Y3, and X2, respectively, of FIG. 12F after a processing operation according to one or more embodiments;

FIG. 12F depicts a top-down reference view of the semiconductor wafer according to one or more embodiments;

FIGS. 14A, 14B, 14C, 14D, and 14E depict cross-sectional views taken along the lines Y1, Y2, X1, Y3, and X2, respectively, of FIG. 14F after a processing operation according to one or more embodiments;

FIG. 14F depicts a top-down reference view of the semiconductor wafer according to one or more embodiments;

Figure 7A:
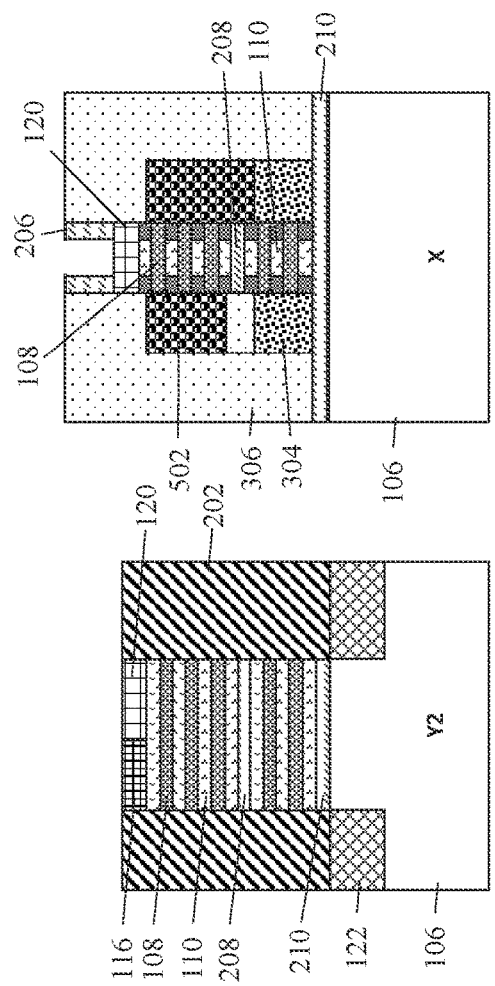
FIGS. 7A, 7B, 7C, and 7D depict cross-sectional views taken along the lines Y1, Y2, X, and Y3, respectively, of FIG. 7E after a processing operation according to one or more embodiments.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another. Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

There are several nonplanar transistor architectures for scaling transistors beyond the 7 nm node, but each is currently limited due to various factors. One such architecture is the so-called stacked field effect transistor (SFET). To increase the available computing power per unit area, SFETs vertically stack two (or more) FETs over a shared substrate footprint. The resultant stacked transistor architecture offers several improvements over planar and fin-type devices, such as the ability to build complementary devices (e.g., CMOS) at a reduced footprint. SFET fabrication is challenging, however, and efforts are ongoing to design SFET fabrication schemes and structures that are suitable for scaled production.

One such challenge is found in the on-chip integration of non-logic components and composite logic components, such as inverters, within the SFET architecture (i.e., alongside the SFET transistors). On-chip integrations are difficult for SFETs, as any additional components must be customized for the stacked configuration inherent to SFETs. On-chip inverter integrations, for example, must solve a variety of issues, such as handling the incoming high aspect ratios, compatibility with shallow/deep contact patterning, n/p isolations, etc.

Turning now to an overview of aspects of the present invention, one or more embodiments of the invention address the above-described shortcomings by providing fabrication methods and resulting structures for SFETs having integrated vertical inverters. Integrating vertical inverters on-chip allows for a reduction in cell size for various composite structures, such as in SRAMs and ring oscillator devices.

Turning now to a more detailed description of fabrication operations and resulting structures according to aspects of the invention, FIG. 1A depicts a top-down reference view of a semiconductor wafer 100 in accordance with one or more embodiments of the invention. FIG. 1B depicts a cross-sectional view taken along the lines Y1/Y2/Y3 of FIG. 1A of the semiconductor wafer 100 after an initial set of fabrication operations have been applied as part of a method of fabricating a final semiconductor device according to one or more embodiments of the invention.

As shown in FIG. 1B, a first nanosheet stack 102 is formed over a second nanosheet stack 104. The first nanosheet stack 102 and the second nanosheet stack 104 are together formed over a substrate 106. In some embodiments, the first nanosheet stack 102 and the second nanosheet stack 104 each include one or more nanosheets 108 alternating with two or more sacrificial layers 110. In some embodiments, the nanosheets 108 and the sacrificial layers 110 are epitaxially grown layers. For ease of discussion reference is made to operations performed on and to a structure having three top sheets (e.g., the three nanosheets 108 of the first nanosheet stack 102 shown in FIG. 1A) and two bottom sheets (e.g., the two nanosheets 108 of the second nanosheet stack 104 shown in FIG. 1A). It is understood, however, that the first nanosheet stack 102 and the second nanosheet stack 104 can include any number of nanosheets alternating with a corresponding number of sacrificial layers. For example, either/both of the nanosheet stacks 102, 104 can include two nanosheets, five nanosheets, eight nanosheets, 30 nanosheets (e.g., 3D NAND), or any number of nanosheets, along with a corresponding number of sacrificial layers (i.e., as appropriate to form a nanosheet stack having a topmost sacrificial layer, a bottommost sacrificial layer, and a sacrificial layer between each pair of adjacent nanosheets). Moreover, it is not necessary that the first nanosheet stack 102 and the second nanosheet stack 104 have a same number of nanosheets 108, and other configurations having any distribution of nanosheets is within the contemplated scope of this disclosure.

The nanosheets 108 and the substrate 106 can be made of any suitable semiconductor material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlInAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys. The nanosheets 108 and the substrate 106 can be made of the same, or different, semiconductor materials. In some embodiments, the nanosheets 108 have a thickness of about 5 nm to about 15 nm, for example 10 nm, although other thicknesses are within the contemplated scope of this disclosure.

In some embodiments, the substrate 106 is structured as a silicon-on-insulator (SOI) substrate having a buried oxide layer (not separately shown). The buried oxide layer can be made of any suitable material, such as, for example, silicon oxide ($SiO_2$) or silicon germanium. In some embodiments, the buried oxide layer is formed to a thickness of about 10-200 nm, although other thicknesses are within the contemplated scope of this disclosure.

The sacrificial layers 110 can made of silicon, silicon germanium, or other semiconductor materials, depending on the material of the nanosheets 108, to meet etch selectivity requirements. For example, in embodiments where the nanosheets 108 are silicon nanosheets, the sacrificial layers 110 can be silicon germanium layers. In embodiments where the nanosheets 108 are silicon germanium nanosheets, the sacrificial layers 110 can be silicon layers or silicon germanium layers having a germanium concentration that is greater than the germanium concentration in the nanosheets 108. For example, if the nanosheets 108 are silicon germanium having a germanium concentration of 5 percent (sometimes referred to as SiGe5), the sacrificial layers 110 can be silicon germanium layers having a germanium concentration of 25 percent (SiGe25), although other germanium concentrations are within the contemplated scope of this disclosure. In some embodiments, the sacrificial layers 110 have a thickness of about 5 nm to about 12 nm, for example 10 nm, although other thicknesses are within the contemplated scope of this disclosure.

In some embodiments, the first nanosheet stack 102 and the second nanosheet stack 104 are separated from the substrate 106 by a sacrificial isolation structure 112. In some embodiments, the first nanosheet stack 102 and the second nanosheet stack 104 are themselves separated by a sacrificial isolation structure 114. The sacrificial isolation structures 112, 114 can include the same or different sacrificial materials selected to ensure etch selectivity with respect to the nanosheets 108 and the sacrificial layers 110. For example, in embodiments where the nanosheets 108 are silicon nanosheets and the sacrificial layers 110 are SiGe30 layers, the sacrificial isolation structures 112, 114 can be SiGe55 layers, although other germanium concentrations are within the contemplated scope of this disclosure. In some embodiments, the sacrificial isolation structures 112, 114 are formed to a thickness of 5 to 25 nanometers, for example 10 nanometers, although other thicknesses are within the contemplated scope of this disclosure.

As further shown in FIG. 1B, a first hard mask 116 can be formed over the nanosheet stacks 102, 104 and a second hard mask 118 can be formed over the first hard mask 116. The first hard mask 116 and the second hard mask 118 can be made of any suitable materials. In some embodiments, the first hard mask 116 is a silicon oxide hard mask and the second hard mask 118 is a silicon nitride hard mask, although other materials are within the contemplated scope of this disclosure.

FIG. 1C depicts a cross-sectional view taken along the lines Y1/Y2/Y3 of FIG. 1A of the semiconductor wafer 100 after a processing operation according to one or more embodiments. In some embodiments, the first hard mask 116 and the second hard mask 118 are patterned to expose a surface of the first nanosheet stack 102. Any known method for patterning a hard mask can be used, such as, for example, a wet etch, a dry etch, or a combination of sequential wet and/or dry etches.

As shown in FIG. 1C, a third hard mask 120 can be formed over the exposed portions of the first nanosheet stack 102. The third hard mask 120 can be made of any suitable hard mask material having etch selectivity to the material of the first hard mask 116. For example, in embodiments where the first hard mask 116 is a silicon oxide-based hard mask, the third hard mask 120 can be made of silicon carbide (SiC), silicon carbonitride (SiCO), silicon borocarbonitrides (SiBCN), and silicon oxynitrides (SiON), although other dielectrics are within the contemplated scope of this disclosure.

FIG. 1D depicts a cross-sectional view taken along the lines Y1/Y2/Y3 of FIG. 1A of the semiconductor wafer 100 after a processing operation according to one or more embodiments. In some embodiments, the first nanosheet stack 102 and the second nanosheet stack 104 can be patterned in a process referred to as nanosheet (or stack) patterning. In some embodiments, portions of the first nanosheet stack 102 and the second nanosheet stack 104 are removed to expose a surface of the substrate 106, which is then recessed.

FIG. 1E depicts a cross-sectional view taken along the lines Y1/Y2/Y3 of FIG. 1A of the semiconductor wafer 100 after a processing operation according to one or more embodiments. In some embodiments, a shallow trench isolation (STI) region 122 can be formed by refilling the cavity with dielectrics. In some embodiments, the STI region 122 is formed by depositing dielectric material over the recessed surface of the substrate 106. As shown in FIG. 1E, the semiconductor wafer 100 can be polished or otherwise planarized to a surface of the first hard mask 116. The semiconductor wafer 100 can be polished using any suitable method, such as, for example, chemical mechanical planarization (CMP).

FIGS. 2A, 2B, and 2C depict cross-sectional views taken along the lines Y1/Y3, Y2, and X, respectively, of FIG. 2D of the semiconductor wafer 100 after a processing operation according to one or more embodiments. FIG. 2D depicts a top-down reference view of the semiconductor wafer 100 according to one or more embodiments.

In some embodiments, a sacrificial gate 202 (sometimes referred to as a dummy gate) is formed and patterned over channel regions of the first nanosheet stack 102 and the second nanosheet stack 104. As used herein, a "channel region" refers to a portion of a nanosheet over which a conductive gate (described in further detail later) is formed, and through which current passes from source to drain in the final device.

The sacrificial gate 202 can be made of any suitable material, such as, for example, amorphous silicon or polysilicon. Any known method for patterning a sacrificial gate can be used, such as, for example, a wet etch, a dry etch, or a combination of sequential wet and/or dry etches. In some embodiments, a hard mask 204 (gate hard mask) is formed on the sacrificial gate 202. The hard mask 204 can be made of any suitable materials, such as, for example, silicon nitride.

As shown in FIGS. 2A, 2B, and 2C, the sacrificial isolation structures 112, 114 can be removed to define cavities (not separately shown). The sacrificial isolation structures 112, 114 can be removed using, for example, a wet etch, a dry etch, or a combination of sequential wet and/or dry etches. In some embodiments, the sacrificial isolation structures 112, 114 are removed selective to the nanosheets 108 and the sacrificial layers 110.

As further shown in FIGS. 2A, 2B, and 2C, gate spacers 206 are formed on sidewalls of the sacrificial gate 202. This process can be referred to as the gate spacer module. The gate spacers 206 can be made of any suitable dielectric material, such as, for example, silicon oxide, silicon nitride, silicon carbide, hydrogenated silicon carbonitrides, silicon oxynitrides, and silicon borocarbonitrides, although other dielectrics are within the contemplated scope of this disclosure. In some embodiments, spacer material is deposited over the semiconductor wafer 100 and patterned using an anisotropic etch, for example, a reactive ion etch (RIE). In some embodiments, the cavities (not separately shown) defined by the removal of the sacrificial isolation structures 112, 114 are filled with dielectrics during the gate spacer module, defining a middle dielectric isolation (MDI) 208, a bottom dielectric isolation (BDI) 210, an isolation spacers 212.

FIGS. 3A, 3B, and 3C depict cross-sectional views taken along the lines Y1/Y3, Y2, and X, respectively, of FIG. 3D of the semiconductor wafer 100 after a processing operation according to one or more embodiments. FIG. 3D depicts a top-down reference view of the semiconductor wafer 100 according to one or more embodiments. As shown in FIGS. 3A, 3B, and 3C, FEOL fabrication processes are used to form inner spacers 302, bottom source/drain regions 304, and an interlayer dielectric 306 on the bottom source/drain regions 304 and the STI region 122.

In some embodiments, a portion of the first nanosheet stack 102 and a portion of the second nanosheet stack 104 are removed, sidewalls of the sacrificial layers 110 are recessed to define divots (not separately shown), and the inner spacers 302 are formed in the divots. In some embodiments, the sacrificial layers 110 are recessed selective to the nanosheets 108. In some embodiments, the bottom source/drain regions 304 are epitaxially grown or otherwise formed on exposed sidewalls of the nanosheets 108 after recessing the first nanosheet stack 102 and the second nanosheet stack 104.

In some embodiments, the interlayer dielectric 306 is deposited or otherwise formed over the semiconductor wafer 100. The interlayer dielectric 306 can be made of any suitable dielectric material, such as, for example, oxides, a low-k dielectric, nitrides, silicon nitride, silicon oxide, SiON, SiC, SiOCN, and SiBCN.

FIGS. 4A, 4B, 4C, and 4D depict cross-sectional views taken along the lines Y1, Y2, X, and Y3, respectively, of FIG. 4E of the semiconductor wafer 100 after a processing operation according to one or more embodiments. FIG. 4E depicts a top-down reference view of the semiconductor wafer 100 according to one or more embodiments.

As shown in FIGS. 4A, 4B, 4C, and 4D, a mask 402 (also referred to as a block, lithographic pattern, litho mask, etc.) is formed over the semiconductor wafer 100 and patterned to expose regions of the semiconductor wafer 100 (FIGS. 4C and 4D). The mask 402 can be made of any suitable materials and can include, for example, an organic planarization layer (OPL).

In some embodiments, exposed portions of the interlayer dielectric 306 are removed (FIG. 4C) and/or recessed (FIG. 4D) to expose a top surface of the bottom source/drain regions 304. The exposed portions of the interlayer dielectric 306 can be removed and/or recessed using, for example, a wet etch, a dry etch, or a combination of sequential wet and/or dry etches.

FIGS. 5A, 5B, 5C, and 5D depict cross-sectional views taken along the lines Y1, Y2, X, and Y3, respectively, of FIG. 5E of the semiconductor wafer 100 after a processing operation according to one or more embodiments. FIG. 5E depicts a top-down reference view of the semiconductor wafer 100 according to one or more embodiments.

In some embodiments, the mask 402 is removed and top source/drain regions 502 are formed on the top surface of the bottom source/drain regions 304 (FIGS. 5C and 5D) and the top surface of the interlayer dielectric 306 (FIGS. 5A and 5C). The mask 402 can be removed and/or recessed using, for example, an OPL strip, a wet etch, a dry etch, or a combination of sequential wet and/or dry etches.

The top source/drain regions 502 can be formed in a similar manner as the bottom source/drain regions 304 described previously. In some embodiments, the top source/drain regions 502 are epitaxially grown or otherwise formed on exposed sidewalls of the nanosheets 108.

FIGS. 6A, 6B, 6C, and 6D depict cross-sectional views taken along the lines Y1, Y2, X, and Y3, respectively, of FIG. 6E of the semiconductor wafer 100 after a processing operation according to one or more embodiments. FIG. 6E depicts a top-down reference view of the semiconductor wafer 100 according to one or more embodiments.

In some embodiments, the same or different dielectrics are deposited over the semiconductor wafer 100 to extend the interlayer dielectric 306. As shown in FIG. 6B, the semiconductor wafer 100 is polished or otherwise planarized to a surface of the sacrificial gate 202. In some embodiments, the hard mask 204 can be removed prior to the polish, and/or as a result of the polishing.

Figure 7B:
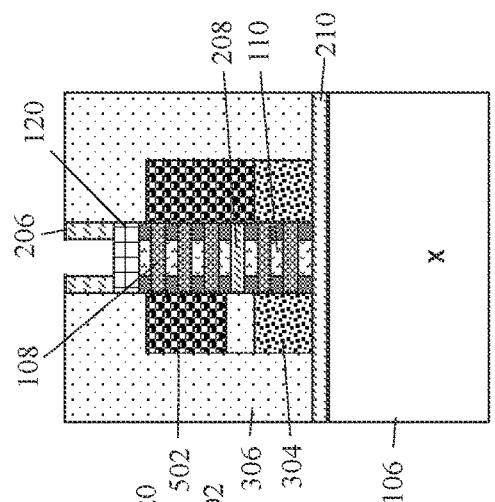
Figure 7C:
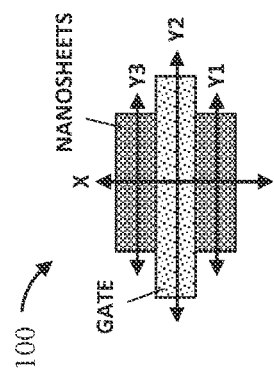
Figure 7D:
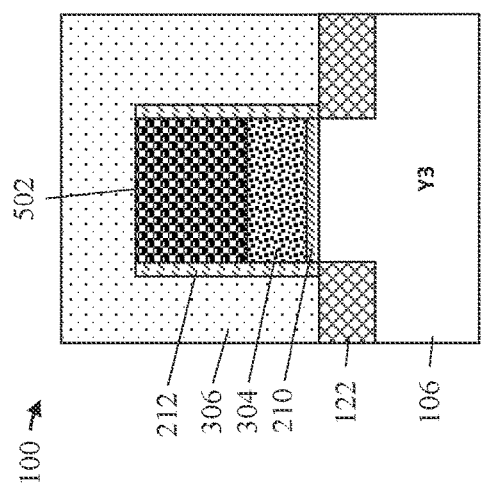
Figure 7E:
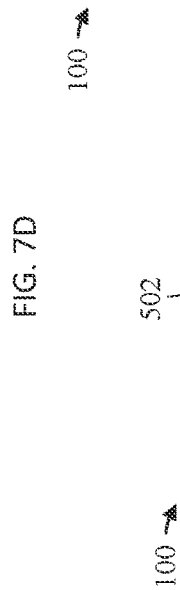
FIG. 7E depicts a top-down reference view of the semiconductor wafer according to one or more embodiments.

FIGS. 7A, 7B, 7C, and 7D depict cross-sectional views taken along the lines Y1, Y2, X, and Y3, respectively, of FIG. 7E of the semiconductor wafer 100 after a processing operation according to one or more embodiments. FIG. 7E depicts a top-down reference view of the semiconductor wafer 100 according to one or more embodiments.

In some embodiments, the sacrificial gate 202 is partially recessed to expose top surfaces of the first hard mask 116 (FIG. 7B) and the third hard mask 120 (FIGS. 7B and 7C). The sacrificial gate 202 can be partially recessed using, for example, a wet etch, a dry etch, or a combination of sequential wet and/or dry etches.

FIGS. 8A, 8B, 8C, and 8D depict cross-sectional views taken along the lines Y1, Y2, X, and Y3, respectively, of FIG. 8E of the semiconductor wafer 100 after a processing operation according to one or more embodiments. FIG. 8E depicts a top-down reference view of the semiconductor wafer 100 according to one or more embodiments.

In some embodiments, exposed portions of the third hard mask 120 are removed using, for example, a wet etch, a dry etch, or a combination of sequential wet and/or dry etches. In some embodiments, exposed portions of the third hard mask 120 are removed selective to the first hard mask 116. In some embodiments, exposed portions (i.e., those portions not covered by the first hard mask 116) of the first nanosheet stack 102 are removed to expose a surface of the MDI 208 (this process is referred to as a top channel cut). In some embodiments, the first nanosheet stack 102 is patterned using an anisotropic etch, for example, a reactive ion etch. In some embodiments, the first nanosheet stack 102 is removed selective to (or to land on) the MDI 208.

FIGS. 9A, 9B, 9C, and 9D depict cross-sectional views taken along the lines Y1, Y2, X, and Y3, respectively, of FIG. 9E of the semiconductor wafer 100 after a processing operation according to one or more embodiments. FIG. 9E depicts a top-down reference view of the semiconductor wafer 100 according to one or more embodiments.

In some embodiments, the first hard mask 116 is removed to expose remaining portions of the first nanosheet stack 102 and the second nanosheet stack 104. In some embodiments, the sacrificial gate 202 and the sacrificial layers 110 are removed to release the nanosheets 108. The sacrificial gate 202 can be removed using a wet etch, a dry etch, or a combination of sequential wet and/or dry etches.

The sacrificial layers 110 can be removed selective to the nanosheets 108. For example, when the nanosheets 108 are formed of silicon and the sacrificial layers 110 are formed of silicon germanium, hydrogen chloride (HCl) gas, or an aqueous solution containing a mix of ammonia and hydrogen peroxide, can be utilized to remove silicon germanium selective to silicon. In another example, when the nanosheets 108 are formed of silicon germanium and the sacrificial layers 110 are formed of silicon, aqueous hydroxide chemistry, including ammonium hydroxide and potassium hydroxide, can be utilized to remove silicon selective to silicon germanium.

Figure 10C:
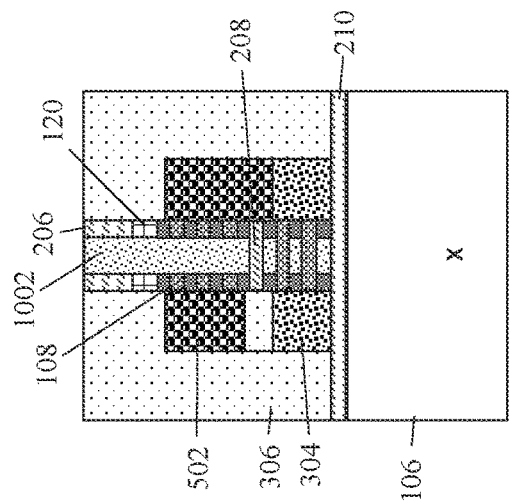
FIGS. 10A, 10B, 10C, and 10D depict cross-sectional views taken along the lines Y1, Y2, X, and Y3, respectively, of FIG. 10E after a processing operation according to one or more embodiments.
Figure 10B:
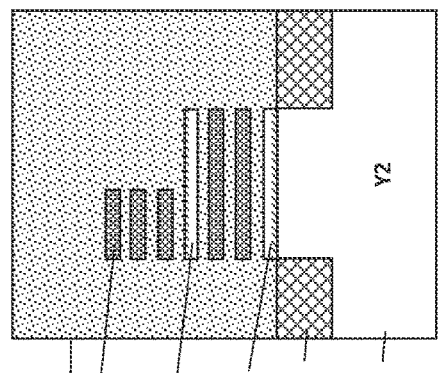
Figure 10E:
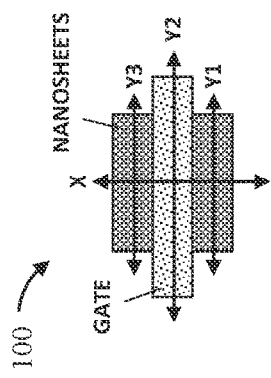
FIG. 10E depicts a top-down reference view of the semiconductor wafer according to one or more embodiments.
Figure 10D:
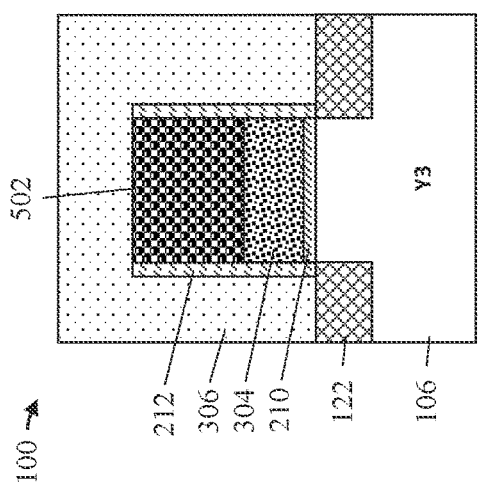
Figure 10A:
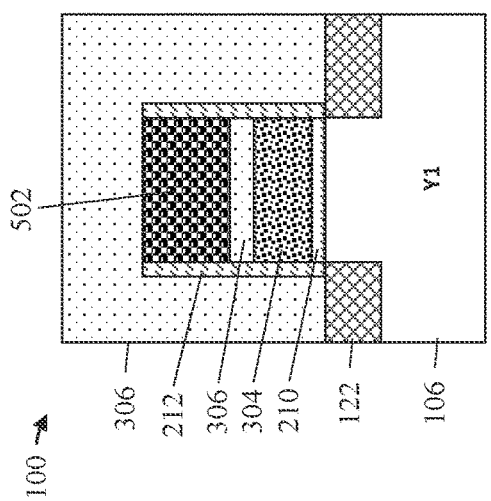

FIGS. 10A, 10B, 10C, and 10D depict cross-sectional views taken along the lines Y1, Y2, X, and Y3, respectively, of FIG. 10E of the semiconductor wafer 100 after a processing operation according to one or more embodiments. FIG. 5E depicts a top-down reference view of the semiconductor wafer 100 according to one or more embodiments.

In some embodiments, the removed sacrificial gate 202 (FIG. 9B) can be replaced with a conductive gate 1002. The conductive gate 1002 can be a high-k metal gate (HKMG) formed over channel regions of the first nanosheet stack 102 and the second nanosheet stack 104 using, for example, known replacement metal gate (RMG) processes, or so-called gate-last processes. In some embodiments, the conductive gate 1002 can include a gate dielectric and a work function metal stack (not separately depicted).

In some embodiments, the gate dielectric is a high-k dielectric film formed on a surface (sidewall) of the nanosheets 108. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of this disclosure.

The work function metal stack, if present, can include one or more work function layers positioned between the high-k dielectric film and a bulk gate material. In some embodiments, the conductive gate 1002 includes one or more work function layers, but does not include a bulk gate material. The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layers can serve to modify the work function of the conductive gate 1002 and enables tuning of the device threshold voltage. The work function layers can be formed to a thickness of about 0.5 to 6 nm, although other thicknesses are within the contemplated scope of this disclosure. In some embodiments, each of the work function layers can be formed to a different thickness.

In some embodiments, the conductive gate 1002 includes a main body formed from bulk conductive gate material(s) deposited over the work function layers and/or gate dielectrics. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive gate materials can further include dopants that are incorporated during or after deposition.

FIGS. 11A, 11B, 11C, 11D, and 11E depict cross-sectional views taken along the lines Y1, Y2, X1, Y3, and X2, respectively, of FIG. 11F of the semiconductor wafer 100 after a processing operation according to one or more embodiments. FIG. 11F depicts a top-down reference view of the semiconductor wafer 100 in accordance with one or more embodiments of the invention. In some embodiments, known FEOL and MOL fabrication operations are used to extend the interlayer dielectric 306 with the same or different dielectrics and to form a bottom contact trench 1102 that exposes a surface of the interlayer dielectric 306 below the top source/drain regions 502. This process can be referred to as a first stage of bottom contact patterning.

FIGS. 12A, 12B, 12C, 12D, and 12E depict cross-sectional views taken along the lines Y1, Y2, X1, Y3, and X2, respectively, of FIG. 12F of the semiconductor wafer 100 after a processing operation according to one or more embodiments. FIG. 12F depicts a top-down reference view of the semiconductor wafer 100 according to one or more embodiments. In some embodiments, exposed portions of the top source/drain regions 502 and exposed portions of the nanosheets 108 (i.e., those portions exposed to the bottom contact trench 1102) are removed and/or recessed to extend the bottom contact trench 1102. In some embodiments, the top source/drain regions 502 and/or the nanosheet 108 are recessed from the bottom contact trench 1102 by a selective isotropic undercut. This process can be referred to as a second stage of bottom contact patterning.

Figure 13F:
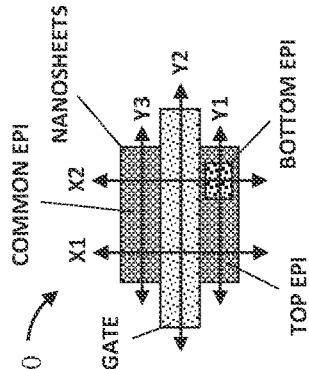
FIG. 13F depicts a top-down reference view of the semiconductor wafer according to one or more embodiments.

FIGS. 13A, 13B, 13C, 13D, and 13E depict cross-sectional views taken along the lines Y1, Y2, X1, Y3, and X2, respectively, of FIG. 13F of the semiconductor wafer 100 after a processing operation according to one or more embodiments. FIG. 13F depicts a top-down reference view of the semiconductor wafer 100 according to one or more embodiments. In some embodiments, an isolation structure 1302 is formed in the openings and/or recesses formed during the second stage of bottom contact patterning. The isolation structure 1302 can be formed using any suitable dielectrics, such as, for example, silicon oxide, silicon nitride, SiON, SiC, SiOCN, and SiBCN.

Figure 13E:
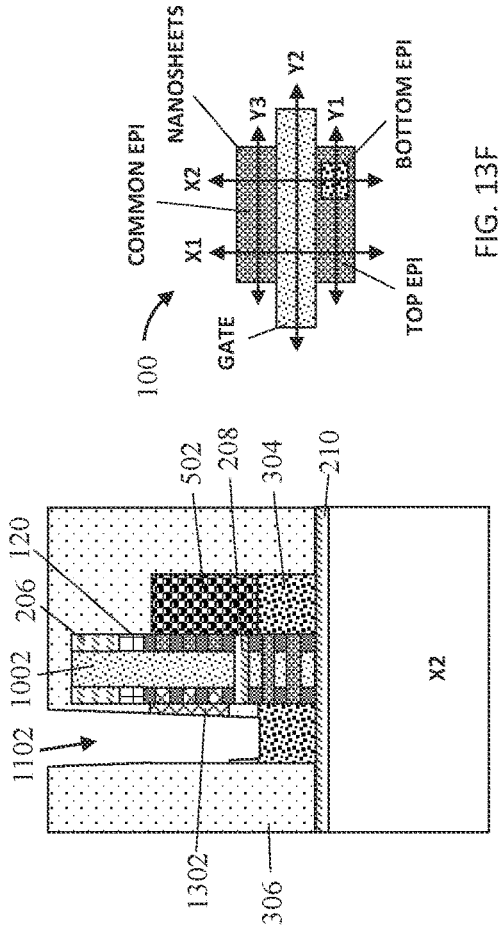
FIGS. 13A, 13B, 13C, 13D, and 13E depict cross-sectional views taken along the lines Y1, Y2, X1, Y3, and X2, respectively, of FIG. 13F after a processing operation according to one or more embodiments.
Figure 13D:
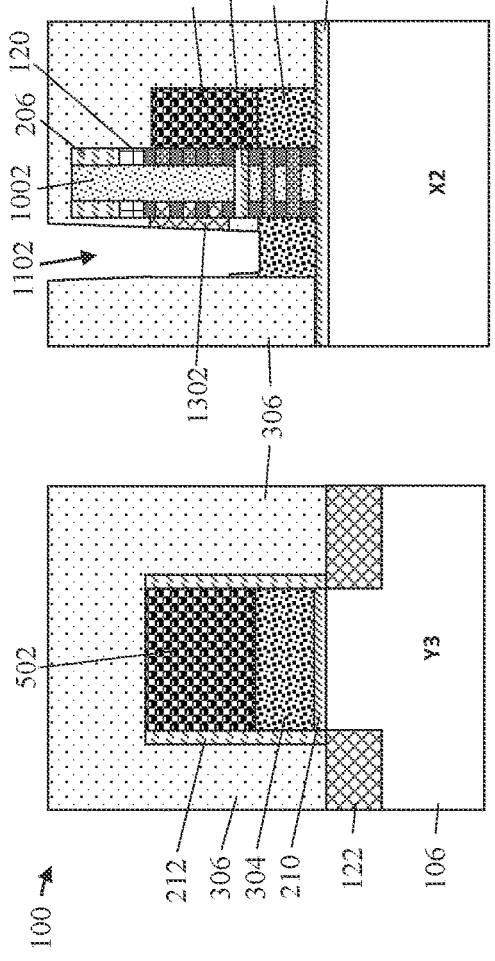
Figure 13C:
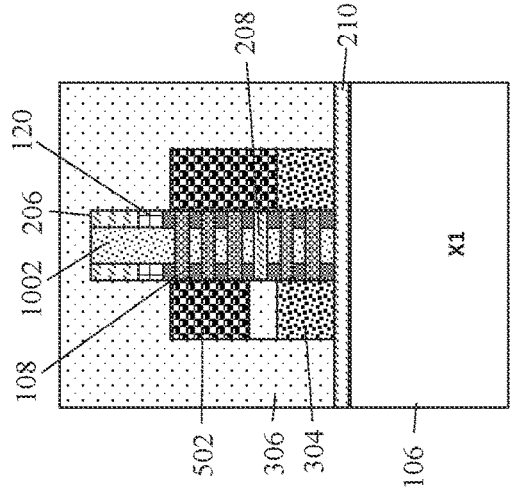
Figure 13B:
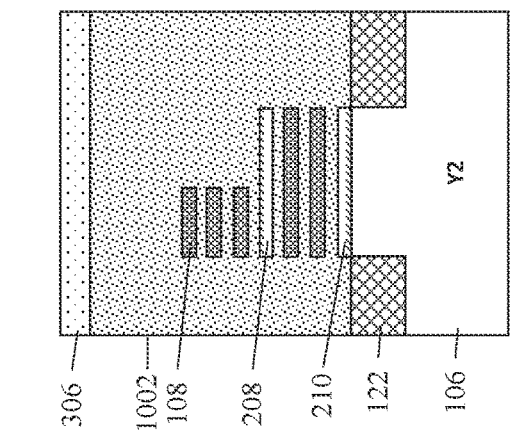
Figure 13A:
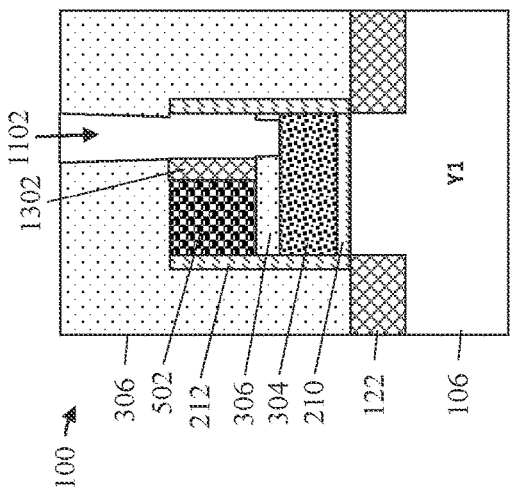

As shown in FIGS. 13A and 13E, in some embodiments, the bottom contact trench 1102 can be extended through the interlayer dielectric 306 to expose a surface of the bottom source/drain regions 304. This process can be referred to as a third stage of bottom contact patterning.

FIGS. 14A, 14B, 14C, 14D, and 14E depict cross-sectional views taken along the lines Y1, Y2, X1, Y3, and X2, respectively, of FIG. 14F of the semiconductor wafer 100 after a processing operation according to one or more embodiments. FIG. 14F depicts a top-down reference view of the semiconductor wafer 100 according to one or more embodiments.

In some embodiments, contacts (e.g., the contact 1402, sometimes referred to as the top epitaxy contact (TE) or the shallow contact, the contact 1404, sometimes referred to as the common epitaxy contact (CE), the contact 1406, sometimes referred to as the bottom epitaxy contact (BE) or the deep contact, and gate contacts, not separately shown) are made to various device substructures. Observe that the resulting structure has a connection path TE→top source/drain regions 502→top channel(s) (nanosheets 108 of the first nanosheet stack 102, e.g., PFET channels)→shorted epi→bottom channel(s) (nanosheets 108 of the second nanosheet stack 104, e.g., NFET channels)→bottom source/drain regions 304→BE.

After contact processing is complete, the semiconductor wafer 100 can be finalized using known processes (e.g., additional MOL and BEOL processing, including the incorporation of additional $M_x$ metallization layers, far back end of line (FBEOL) processing, packaging module(s), etc.) to define a final device.

Figure 15:
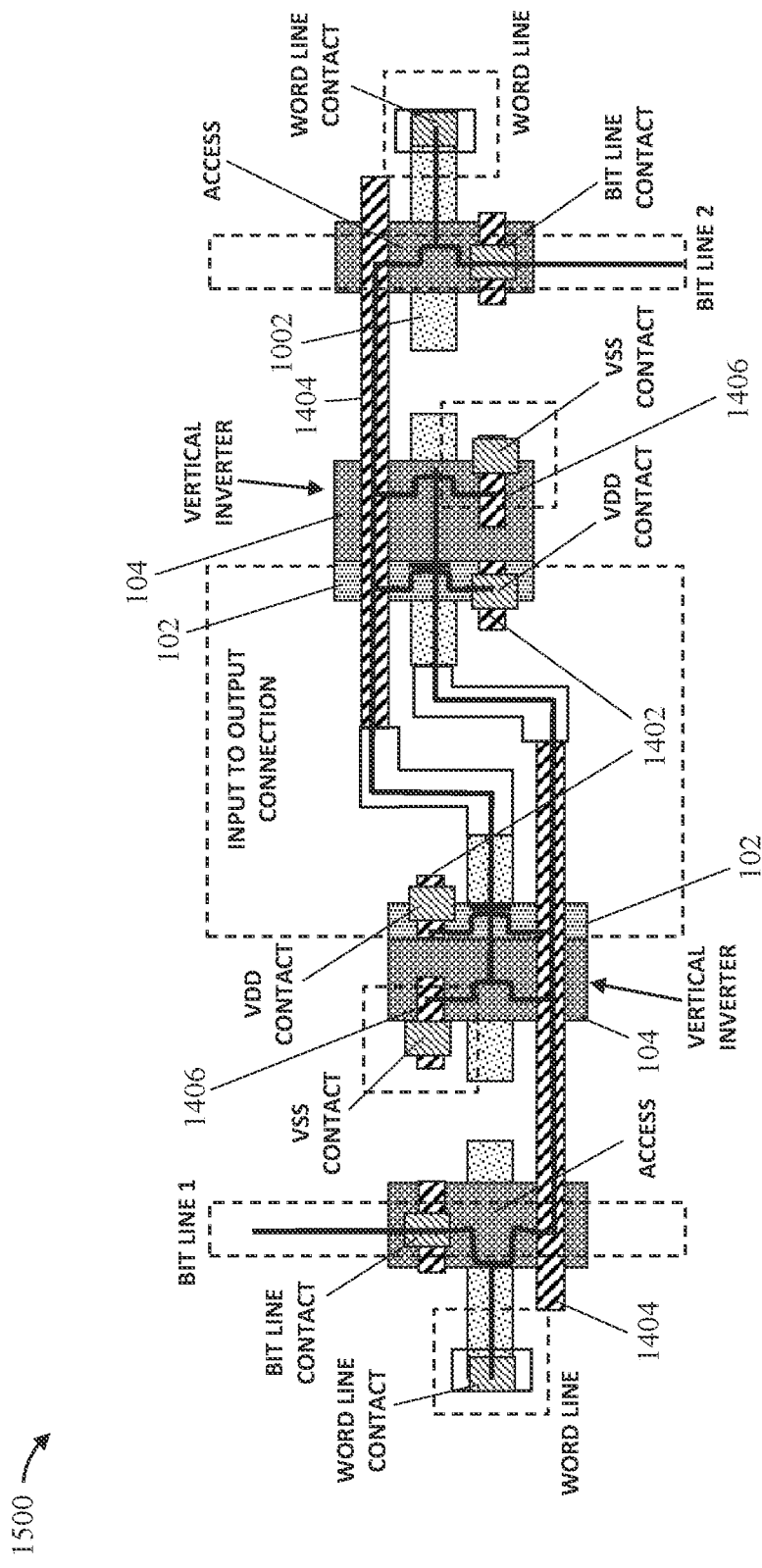
FIG. 15 depicts a schematic view of an SRAM constructed in accordance with one or more embodiments.

FIG. 15 depicts a schematic view of an SRAM 1500 constructed in accordance with one or more embodiments. As shown in FIG. 15, the SRAM 1500 can be formed from two cross-coupled vertical inverters, each of which can be formed as described previously herein with respect to the processing of the semiconductor wafer 100. Various components of each vertical inverter (e.g., TE 1402, CE 1404, BE 1406, top nanosheet stack 102, bottom nanosheet stack 104, conductive gate 1002) are shown, although other components are omitted for clarity. The vertical inverters are electrically coupled to a word line and bit lines (e.g., bit line 1 and bit line 2) via access transistors in an outward configuration, although other SRAM configurations are within the contemplated scope of this disclosure. Note that the wire between the word line contacts is omitted for clarity. Advantageously, forming an SRAM 1500 from vertical inverters having vertically stacked transistors in this manner enables better cell size scaling.

In some embodiments, a gate of a first access transistor is coupled to the word line and a gate of a second access transistor is also coupled to the word line. In some embodiments, the first access transistor is further coupled to the first bit line and the second access transistor is further coupled to the second bit line.

Figure 16:
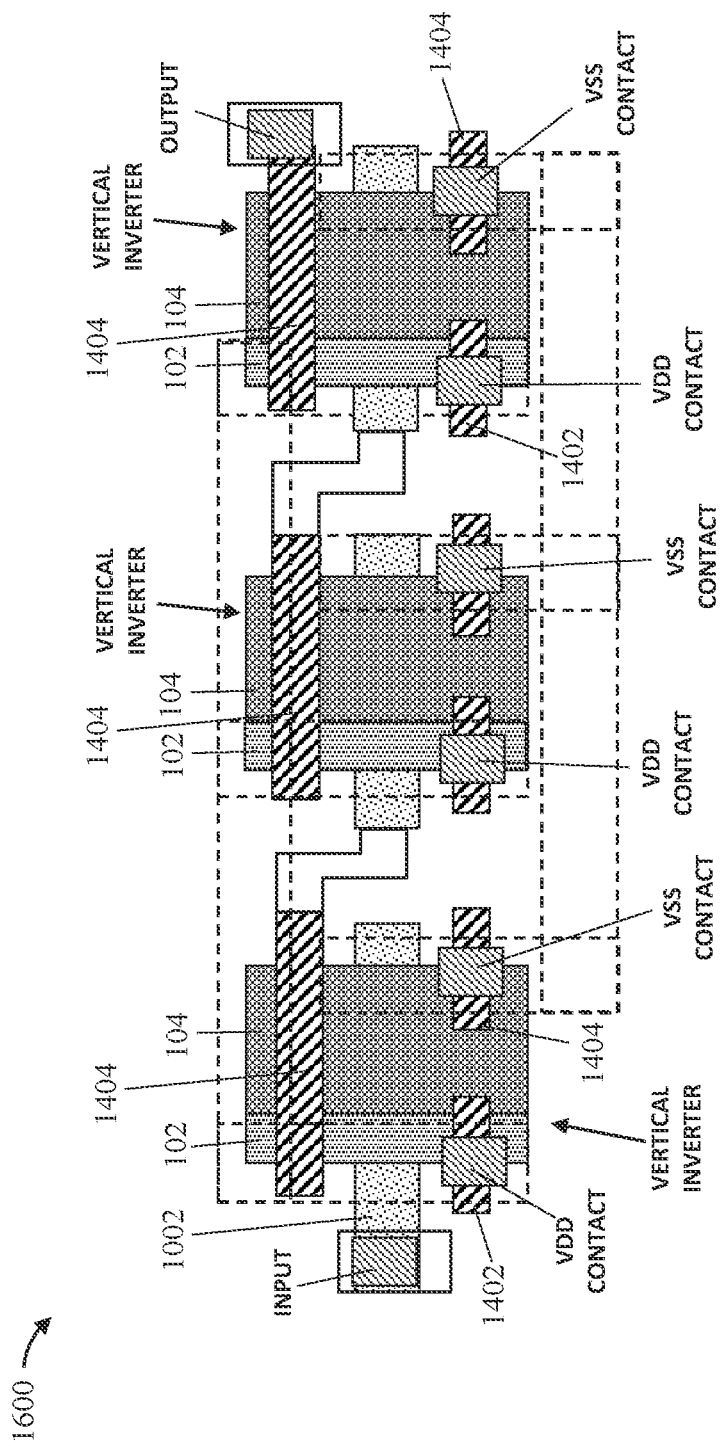
FIG. 16 depicts a schematic view of a ring oscillator device constructed in accordance with one or more embodiments.

FIG. 16 depicts a schematic view of a ring oscillator device 1600 constructed in accordance with one or more embodiments. As shown in FIG. 16, the ring oscillator device 1600 can be formed from three cross-coupled vertical inverters, each of which can be formed as described previously herein with respect to the processing of the semiconductor wafer 100. Various components of each vertical inverter (e.g., TE 1402, CE 1404, BE 1406, top nanosheet stack 102, bottom nanosheet stack 104, conductive gate 1002) are shown, although other components are omitted for clarity. The vertical inverters are electrically coupled to an input and an output of the ring oscillator device 1600. Advantageously, forming an ring oscillator device 1600 from vertical inverters having vertically stacked transistors in this manner enables better cell size scaling.

The three vertical inverters include a first vertical inverter, a third vertical inverter, and a second vertical inverter between the first vertical inverter and the third vertical inverter. In some embodiments, an input terminal ("INPUT") is coupled to a gate of the first vertical inverter and an output terminal ("OUTPUT") is coupled to a contact of the third vertical inverter.

Figure 17:
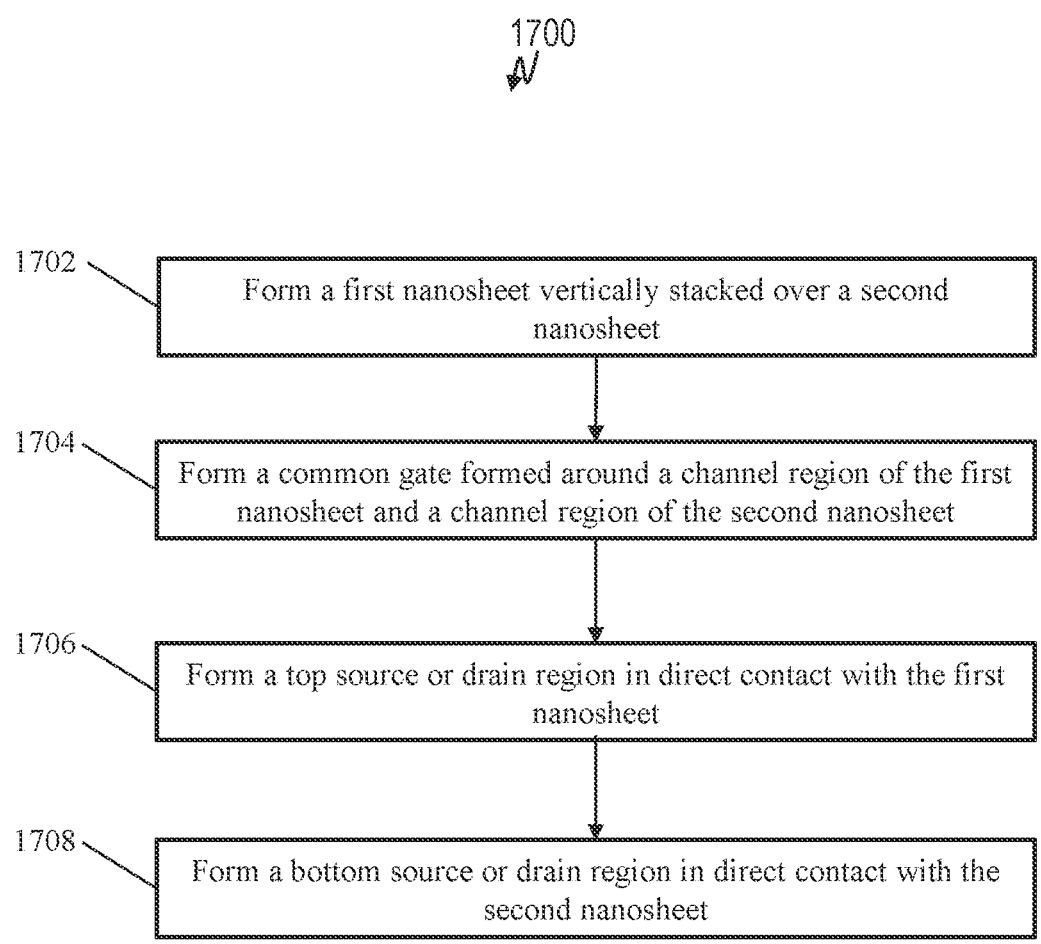
FIG. 17 depicts a flow diagram illustrating a method according to one or more embodiments of the invention.

FIG. 17 depicts a flow diagram illustrating a method 1700 for fabricating an SFET having on-chip vertical inverters according to one or more embodiments of the invention. As shown at block 1702, a first nanosheet is vertically stacked over a second nanosheet. In some embodiments, a first sidewall of the first nanosheet is coplanar to a first sidewall of the second nanosheet. In some embodiments, a second sidewall of the first nanosheet is recessed with respect to a second sidewall of the second nanosheet. At block 1704, a common gate is formed around a channel region of the first nanosheet and a channel region of the second nanosheet.

At block 1706, a top source or drain region is formed in direct contact with the first nanosheet. At block 1708, a bottom source or drain region is formed in direct contact with the second nanosheet. In some embodiments, a first portion of the top source or drain region is shorted to a first portion of the bottom source or drain region to define a common source or drain region. In some embodiments, a second portion of the top source or drain region is electrically coupled to a second portion of the bottom source or drain region in series through the first nanosheet, the common source or drain region, and the second nanosheet. In some embodiments, the top source or drain region includes a first doping type and the bottom source or drain region includes a second doping type opposite the first doping type.

The method can further include forming a first nanosheet stack that includes the first nanosheet and one or more additional nanosheets and forming a second nanosheet stack that includes the second nanosheet and one or more additional nanosheets. In some embodiments, the semiconductor device includes a stacked field effect transistor. In some embodiments, the stacked field effect transistor includes a complementary stacked field effect transistor comprising an nFET and a pFET. In some embodiments, the first nanosheet stack defines a portion of one of the nFET and the pFET and the second nanosheet stack defines a portion of the other one of the nFET and the pFET.

The method can further include forming a middle dielectric isolation structure between the first nanosheet and the second nanosheet. In some embodiments, the middle dielectric isolation structure is in direct contact with the common source or drain region.

In some embodiments, a bottom source or drain contact is formed on a surface of the bottom source or drain region. In some embodiments, an isolation structure is formed between the bottom source or drain contact and the top source or drain region. A portion of the isolation structure is between the bottom source or drain contact and the common gate.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop (i.e., the second element remains).

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the invention of the invention, epitaxial growth and/or deposition processes can be selective to forming on semiconductor surface, and may or may not deposit material on other exposed surfaces, such as silicon dioxide or silicon nitride surfaces.

As used herein, "p-type" refers to the addition of impurities to an intrinsic semiconductor that creates deficiencies of valence electrons. In a silicon-containing substrate, examples of p-type dopants, i.e., impurities, include but are not limited to, boron, aluminum, gallium, and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a first nanosheet vertically stacked over a second nanosheet;
    forming a common gate around a channel region of the first nanosheet and a channel region of the second nanosheet;
    forming a top source or drain region in direct contact with the first nanosheet; and
    forming a bottom source or drain region in direct contact with the second nanosheet;
    wherein a first portion of the top source or drain region is shorted to a first portion of the bottom source or drain region via a direct epitaxy contact growth of the first portion of the top source or drain region on a surface of the first portion of the bottom source or drain region to define a common source or drain region; and
    wherein a second portion of the top source or drain region is electrically coupled to a second portion of the bottom source or drain region in series through the first nanosheet, the common source or drain region, and the second nanosheet.

2. The method of claim 1, further comprising:
forming a first nanosheet stack comprising the first nanosheet and one or more additional first nanosheets; and
forming a second nanosheet stack comprising the second nanosheet and one or more additional second nanosheets.

3. The method of claim 2, wherein the semiconductor device comprises a stacked field effect transistor.

4. The method of claim 3, wherein the stacked field effect transistor comprises a complementary stacked field effect transistor comprising an nFET and a pFET.

5. The method of claim 4, wherein the first nanosheet stack defines a portion of one of the nFET and the pFET and the second nanosheet stack defines a portion of the other one of the nFET and the pFET.

6. The method of claim 5, further comprising forming a middle dielectric isolation structure between the first nanosheet and the second nanosheet, the middle dielectric isolation structure in direct contact with the common source or drain region.

7. The method of claim 6, wherein the top source or drain region comprises a first doping type and the bottom source or drain region comprises a second doping type opposite the first doping type.

8. The method of claim 1, wherein a first sidewall of the first nanosheet is coplanar to a first sidewall of the second nanosheet, and wherein a second sidewall of the first nanosheet is recessed with respect to a second sidewall of the second nanosheet.

9. The method of claim 1, further comprising forming a bottom source or drain contact on a surface of the bottom source or drain region.

10. The method of claim 9, further comprising forming an isolation structure between the bottom source or drain contact and the top source or drain region, wherein a portion of the isolation structure is between the bottom source or drain contact and the common gate.

11. A semiconductor device comprising:
a first nanosheet vertically stacked over a second nanosheet;
a common gate formed around a channel region of the first nanosheet and a channel region of the second nanosheet;
a top source or drain region in direct contact with the first nanosheet; and
a bottom source or drain region in direct contact with the second nanosheet;
wherein a first portion of the top source or drain region is shorted to a first portion of the bottom source or drain region via direct epitaxy contact between the first portion of the top source or drain region and a surface of the first portion of the bottom source or drain region to define a common source or drain region; and
wherein a second portion of the top source or drain region is electrically coupled to a second portion of the bottom source or drain region in series through the first nanosheet, the common source or drain region, and the second nanosheet.

12. The semiconductor device of claim 11, further comprising:
a first nanosheet stack comprising the first nanosheet and one or more additional first nanosheets; and
a second nanosheet stack comprising the second nanosheet and one or more additional second nanosheets.

13. The semiconductor device of claim 12, wherein the semiconductor device comprises a stacked field effect transistor.

14. The semiconductor device of claim 13, wherein the stacked field effect transistor comprises a complementary stacked field effect transistor comprising an nFET and a pFET.

15. The semiconductor device of claim 14, wherein the first nanosheet stack defines a portion of one of the nFET and the pFET and the second nanosheet stack defines a portion of the other one of the nFET and the pFET.

16. The semiconductor device of claim 15, further comprising a middle dielectric isolation structure between the first nanosheet and the second nanosheet, the middle dielectric isolation structure in direct contact with the common source or drain region.

17. The semiconductor device of claim 16, wherein the top source or drain region comprises a first doping type and the bottom source or drain region comprises a second doping type opposite the first doping type.

18. The semiconductor device of claim 16, wherein a first sidewall of the first nanosheet is coplanar to a first sidewall of the second nanosheet, and wherein a second sidewall of the first nanosheet is recessed with respect to a second sidewall of the second nanosheet.

19. The semiconductor device of claim 11, further comprising a bottom source or drain contact on a surface of the bottom source or drain region.

20. The semiconductor device of claim 19, further comprising an isolation structure between the bottom source or drain contact and the top source or drain region, wherein a portion of the isolation structure is between the bottom source or drain contact and the common gate.

* * * * *